United States Patent
Arimoto et al.

(10) Patent No.: US 6,608,795 B2
(45) Date of Patent: Aug. 19, 2003

(54) SEMICONDUCTOR DEVICE INCLUDING MEMORY WITH REDUCED CURRENT CONSUMPTION

(75) Inventors: Kazutami Arimoto, Hyogo (JP); Hiroki Shimano, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/277,879

(22) Filed: Oct. 23, 2002

(65) Prior Publication Data

US 2003/0039160 A1 Feb. 27, 2003

Related U.S. Application Data

(62) Division of application No. 09/775,712, filed on Feb. 5, 2001, now Pat. No. 6,477,108.

(30) Foreign Application Priority Data

Sep. 1, 2000 (JP) .................................... 2000-265267

(51) Int. Cl.$^7$ ............................................. G11C 8/00
(52) U.S. Cl. .............................. 365/230.03; 365/230.06; 365/233
(58) Field of Search .................... 365/230.03, 230.06, 365/233, 230.01

(56) References Cited

U.S. PATENT DOCUMENTS

| 5,566,108 A | 10/1996 | Kitamura ...................... 365/194 |
| 5,903,514 A | * 5/1999 | Sawada ........................ 365/233 |
| 6,002,615 A | 12/1999 | Sawada ..................... 365/189.01 |
| 6,166,990 A | 12/2000 | Ooishi et al. ................ 365/194 |

FOREIGN PATENT DOCUMENTS

JP  11-297071  10/1999

* cited by examiner

*Primary Examiner*—Hoai Ho
(74) *Attorney, Agent, or Firm*—McDermott, Will & Emery

(57) ABSTRACT

When a row active command ACT_CMD is externally input, an internal clock control circuit activates a signal int.CKE, so that an external clock signal ext.CLK is responsively supplied to an internal memory array as signal int.CLK. Thus, clock control is meticulously conducted, whereby a system LSI with reduced current consumption in the memory array can be realized.

1 Claim, 23 Drawing Sheets

FIG.6 (PRE-DECODING OF LEAST-SIGNIFICANT 2 BITS)

FIG.7 (PRE-DECODING OF UPPER TO LOWER 9 BITS)

SEMICONDUCTOR DEVICE INCLUDING MEMORY WITH REDUCED CURRENT CONSUMPTION

This application is a divisional of application Ser. No. 09/775,712 filed Feb. 5, 2001, now U.S. Pat. No. 6,477,108.

BACKGROUND OF THE INVENTION

1. Field of the Invention

The present invention generally relates to a semiconductor device, and more particularly, relates to a system LSI (Large-Scale Integrated circuit) including a dynamic random access memory (DRAM).

2. Description of the Background Art

In recent years, a DRAM-mounted system LSI has been used which integrates a logic such as processor or ASIC (Application Specific Integrated Circuit) and a mass-storage DRAM on the same semiconductor substrate.

Such a system LSI interconnects the logic with the DRAM through a multi-bit internal data bus in the range from 128 bits to 512 bits, thereby enabling high-speed data transfer that is at least one order or two orders higher than that in the case where a logic LSI and a general-purpose DRAM having a small number of terminals are connected on a printed circuit board.

Moreover, the number of external pin terminals of the logic can be reduced as compared to the case where the general-purpose DRAM is externally connected to the logic.

Furthermore, within the system LSI, the DRAM block and the logic are connected through internal wiring. The internal wiring is short enough as compared to the wiring on the printed circuit board, and has small parasitic impedance. Therefore, a charging/discharging current of the data bus can be significantly reduced, and also high-speed signal transfer can be realized.

For these reasons, the DRAM-mounted system LSI significantly contributes to improved performance of the information equipments for conducting the processing handling a massive amount of data such as three-dimensional graphic processing and image/audio processing.

In developing such a DRAM-mounted system LSI, the DRAM block is supplied as DRAM core having a prescribed storage capacity. The system LSI is developed by arranging and interconnecting the combination of this DRAM core with another logic circuit, test circuit and analog circuit.

The DRAM core includes a memory array including a plurality of memory cells arranged in a matrix, and a control portion for generating a data-transmission/reception control signal based on a signal applied from the logic circuit or the like and applying the control signal to the memory array.

The control portion includes circuitry associated with command generation, row control and column control.

FIG. 23 is a block diagram showing the structure of a control portion 500 associated with command generation and row control in a DRAM core.

Referring to FIG. 23, control portion 500 includes a clock control circuit 522 for generating an internal clock signal int.CLK in response to a clock signal ext.CLK and a clock enable signal CKE, a timing signal generation circuit 524 for generating row timing signals RXT<3:0>, SO<3:0> and RXLATCH<3:0> corresponding to each bank in response to command signals ACT_CMD and PRE_CMD and a bank selection signal BS<3:0>, and a row address processing circuit 526 for outputting pre-decoded signals X0<19:0> to X3<19:0> to be output to each bank, in response to an address signal A<12:0> and the signal RXLATCH<3:0>. Note that, herein, the number of banks is four by way of example.

Clock control circuit 522 includes an internal clock generation circuit 530 for outputting the clock signal int.CLK from the clock signal ext.CLK in response to the clock enable signal CKE applied from a logic circuit or the like.

Timing signal generation circuit 524 includes a bank command generation circuit 534 for outputting command signals ACT<3:0> and PRE<3:0> corresponding to each bank in response to the bank selection signal BS<3:0> and based on the command signals ACT_CMD and PRE_CMD, and a row timing circuit 536 for outputting the row control timing signal RXT<3:0> of a main word line, the sense amplifier activation signal SO<3:0>, and the signal RXLATCH<3:0> that is activated during a row active period of the selected bank, in response to the command signals ACT<3:0> and PRE<3:0>. Each bit of the signals RXT<3:0>, SO<3:0> and RXLATCH<3:0> corresponds to each bank.

Row address processing circuit 526 includes a row address input latch circuit 540 for latching the address signal A<12:0> in response to the signal RXLATCH<3:0> to output row address signals RAF0<12:0> to RAF3<12:0> corresponding to the respective banks, and a row address pre-decode circuit 542 for outputting the pre-decoded signals X0<19:0> to X3<19:0> corresponding to the respective banks in response to the output of row address input latch circuit 540.

The DRAM core generates an internal clock signal even during the standby period, resulting in large current consumption. Accordingly, like a synchronous dynamic random access memory (SDRAM) used as external component of, e.g., a CPU (Central Processing Unit), the DRAM core mounted in the system LSI also has a clock suspend function.

FIG. 24 is a circuit diagram showing the structure of internal clock generation circuit 530 of FIG. 23.

Referring to FIG. 24, internal clock generation circuit 530 includes a CKE control circuit 552 for accepting the clock enable signal CKE in response to the external clock signal ext.CLK to output a clock control signal CKEd_P, and a gate circuit 554 for outputting the internal clock signal int.CLK from external clock signal ext.CLK in response to the clock control signal CKEd_P.

CKE control circuit 552 includes an inverter 556 for receiving and inverting the external clock signal ext.CLK, a flip-flop 558 for accepting the clock enable signal CKE in response to the external clock signal ext.CLK, a buffer circuit 560 for buffering the output of flip-flop 558, and a flip-flop 562 for accepting the output of buffer circuit 560 in response to the output of inverter 556.

Gate circuit 554 includes a NAND circuit 564 for receiving the external clock signal ext.CLK and the clock control signal CKEd_P, and an inverter 566 for receiving and inverting the output of NAND circuit 564 to output the internal clock signal int.CLK.

FIG. 25 is an operation waveform chart illustrating the clock suspend function.

Referring to FIGS. 24 and 25, in response to the fall of the clock enable signal CKE to L level at time t1, CKE control circuit 552 renders the clock control signal CKEd_P to L level from the following falling edge of the external clock signal ext.CLK. NAND circuit 564 responsively masks the external clock signal ext.CLK from time t2. Therefore, the internal clock signal int.CLK is fixed at L level, and the DRAM core is set to a power-down mode.

In response to the rise of the clock enable signal CKE from L level to H level at time t3, supply of the internal clock signal int.CLK to each bank is resumed from time t4.

More specifically, by deactivating the clock enable signal CKE, the internal clock signal int.CLK is stopped one cycle thereafter, thereby entering the power-down mode. For an increased power-down mode period, the memory cell data in each bank is self-refreshed by asynchronously operating self-refresh circuits (not shown) in order to retain the data.

In response to activation of the clock enable signal CKE, the power-down mode is terminated and generation of the internal clock signal int.CLK is resumed one cycle thereafter.

In the conventional internal clock generation circuit, while the clock enable signal CKE is active at H level, the internal clock signal is continuously generated in response to the external clock signal. Particularly in the multi-bank structure, row local control circuits are provided corresponding to the respective banks, and a local clock signal for controlling an address latch circuit in each row local control circuit is generated in response to the internal clock signal, resulting in large current consumption involved in generation of the internal clock signal. Accordingly, even if the frequency of the operation clock is reduced during the standby period for reduction in power consumption, power consumption during the standby period cannot readily be reduced.

SUMMARY OF THE INVENTION

It is an object of the present invention to provide a system LSI including a memory capable of reducing current consumption in the standby state.

In summary, according to one aspect of the present invention, a semiconductor device includes a memory array and a clock processing circuit.

The memory array includes a plurality of memory cells arranged in rows and columns, and conducts data transmission and reception in response to an address signal in synchronization with an internal clock signal. The clock processing circuit transmits a basic clock signal as the internal clock signal to the memory array in response to a command. The command includes a row activation command that indicates start of a row selection operation of the plurality of memory cells for data transmission and reception to and from the memory array. The clock processing circuit includes an internal clock control circuit for activating an internal clock enable signal in response to the row activation command, and an internal clock generation circuit for outputting the internal clock signal based on the basic clock signal in response to activation of the internal clock enable signal, and deactivating the internal clock signal in response to deactivation of the internal clock enable signal.

According to another aspect of the present invention, a semiconductor device includes a plurality of memory banks and a plurality of row address processing circuits.

The plurality of memory banks are capable of designating a different row address. Each of the memory banks includes a plurality of memory cells arranged in rows and columns, and conducts data transmission and reception in synchronization with a clock signal. The plurality of row address processing circuits are provided corresponding to the respective memory banks. The row address processing circuits are responsive to the clock signal to accept and hold a row address signal applied in order to specify a row of the memory cells. Each of the row address processing circuits includes a flip-flop circuit for accepting the row address signal in response to the clock signal, and a clock supply circuit for discontinuing supply of the clock signal to the flip-flop circuit after the corresponding memory bank is selected and the row address signal is accepted in the flip-flop circuit.

Accordingly, a main advantage of the present invention is that power consumption can be reduced by generating the internal clock signal only when access to the memory array occurs in response to command input.

Another advantage of the present invention is that power consumption can be reduced by discontinuing clock supply on a bank-by-bank basis after the address is latched.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
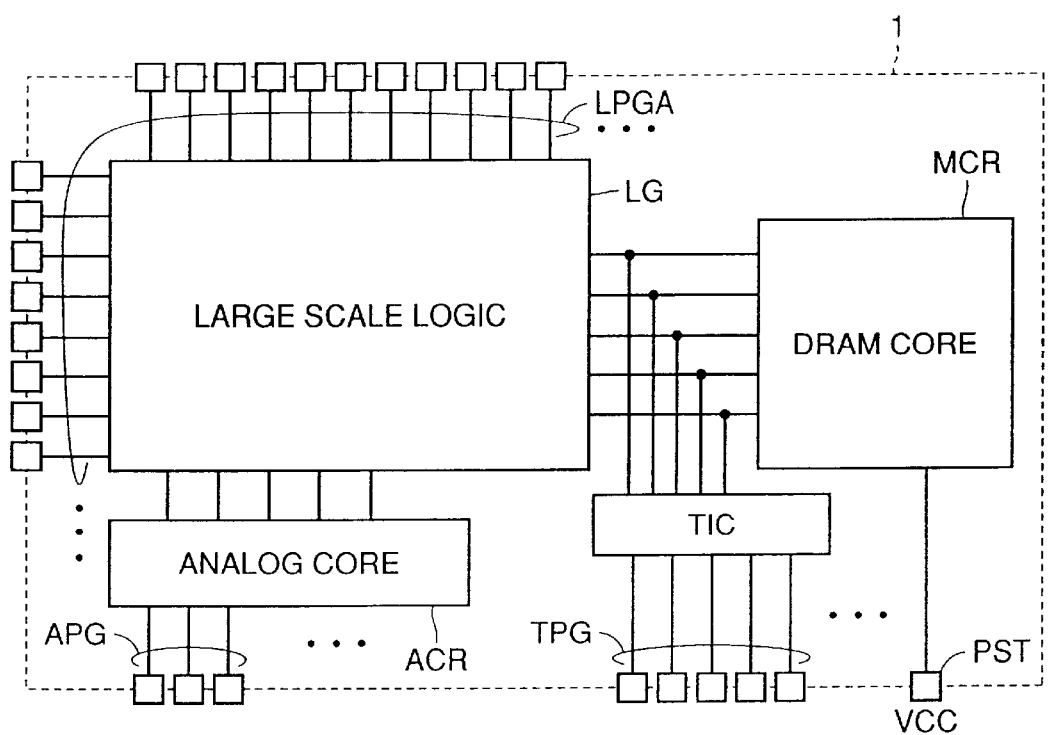
FIG. 1 is a diagram schematically showing the structure of a DRAM-mounted system LSI according to the present invention.

Hereinafter, embodiments of the present invention are described in detail with reference to the accompanying drawings. Note that the same reference numerals and characters denote the same or corresponding elements throughout the figures.

[First Embodiment]

FIG. 1 is a diagram schematically showing the structure of a DRAM-mounted system LSI according to the present invention.

Referring to FIG. 1, system LSI 1 includes a large-scale logic LG coupled to an external pin terminal group LPGA for conducting the processing as instructed, an analog core ACR coupled between large-scale logic LG and an external pin terminal group APG for conducting the processing relating to an analog signal, a DRAM core MCR coupled to large-scale logic LG through internal wiring for storing the data that is required from large-scale logic LG, and a test interface circuit TIC for separating large-scale logic LG and the DRAM from each other in a test mode so as to conduct a test operation to DRAM core MCR through a test pin terminal group TPG. DRAM core MCR receives a power supply voltage VCC through a power-supply pin terminal PST.

Analog core ACR includes a phase lock loop (PLL) for generating an internal clock signal, an analog-digital converter for converting an external analog signal to a digital signal, and a digital-analog converter for converting a digital signal applied from large-scale logic LG to an analog signal for output.

Figure 2:
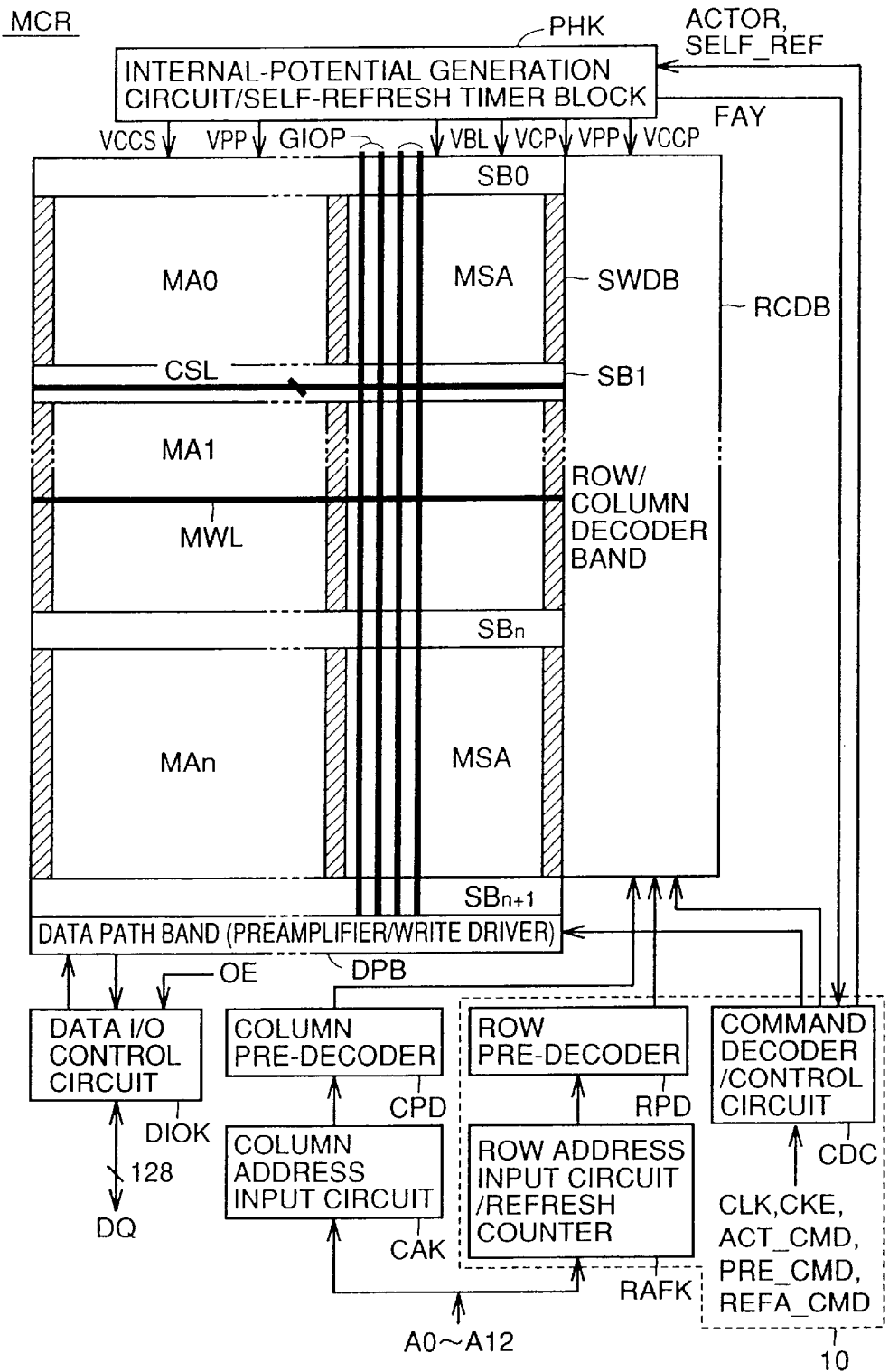
FIG. 2 is a schematic block diagram showing the structure of a DRAM core MCR of FIG. 1.

FIG. 2 is a schematic block diagram showing the structure of a DRAM core MCR in FIG. 1.

Referring to FIG. 2, DRAM core MCR includes a plurality of memory arrays MA0 to MAn, sense amplifier bands SB1 to SBn each provided between corresponding memory arrays MA0 to MAn, and sense amplifier bands SB0 and SBn+1 respectively located outside memory arrays MA0 and MAn. Each of memory arrays MA0 to MAn is divided into a plurality of memory sub arrays MSA by sub word driver bands SWDB.

In each of memory arrays MA0 to MAn, a main word line MWL is provided which is common to memory sub arrays MSA separated by sub word driver bands SWDB. Each main word line MSA is provided corresponding to a prescribed number of sub word lines in each memory sub array MSA of the corresponding memory array. A main word line MWL and a selection signal through a prescribed number of sub decode lines provided on the sense amplifier band are input to a sub word driver, whereby a single sub word line is selected.

Each of sense amplifier bands SB1 to SBn is shared by adjacent memory arrays. A row decoder for selecting a main word line and a sub decode line according to a row address signal is provided corresponding to memory arrays MA0 to MAn. A column decoder for transmitting through a column selection line CSL a column selection signal for selecting a column from the memory array according to a column address signal is provided to be aligned with the row decoder.

Column selection line CSL is provided in the sense amplifier band, and is selected to connect a prescribed number of sense amplifier circuits to a group of internal data line pairs GIOP. A prescribed number of internal data line pairs GIOP extend across memory arrays MA0 to MAn so as to be coupled to the selected sense amplifier circuit through a local data line.

Internal data line pairs GIOP are provided in the range from 128 bits to 512 bits, and coupled to a data path band DPB including preamplifiers and write drivers. The preamplifiers and the write drivers in data path band DPB are provided corresponding to the respective internal data line pairs GIOP. Internal data line pair GIOP may be a transmission line pair for transmitting both write and read data. Alternatively, a bus line pair for transmitting the read data and a write data line pair for transmitting the write data may be separately provided as internal data bus line pair.

DRAM core MCR further includes a control signal processing circuit 10 for receiving, e.g., 13-bit external addresses A0 to A12 from the logic and also receiving control signals such as CLK, CKE, ACT_CMD, PRE_CMD and REFA_CMD from the logic to conduct internal-command generation and row-related address processing, a column address input circuit CAK for receiving, e.g., 13-bit external addresses A0 to A12 from the logic, and a data input/output (I/O) control circuit DIOK for conducting data transfer between data path band DPB and the logic.

Control signal processing circuit 10 includes a command decoder/control circuit CDC for receiving control signals such as CLK, CKE, ACT_CMD, PRE_CMD and REFA_CMD from the logic to produce an internal control signal designating various operations, a row address input circuit/refresh counter RAFK for latching, e.g., 13-bit external addresses A0 to A12 received from the logic as a row address, and internally generating the row address during a refresh period, and a row pre-decoder RPD for pre-decoding the row address to generate a pre-decoded signal for output to the memory array.

Command decoder/control circuit CDC receives the clock signal CLK, clock enable signal CKE, and command signals ACT_CMD, PRE_CMD and REFA_CMD to determine the designated operation mode.

The commands include a row active command for setting a row to the selected state, a read command for designating a data read operation, a write command for designating a data write operation, a pre-charge command for rendering the selected row to the non-selected state, an auto-refresh command for conducting a refresh operation, and a self-refresh command for conducting a self-refresh operation.

Row address input circuit/refresh counter RAFK is responsive to the row active command to accept external address bits A0 to A12 as a row address and produce an internal row address signal under the control of command decoder/control circuit CDC.

Row address input circuit/refresh counter RAFK includes an address buffer for buffering the received address bits, and an address latch for latching an output signal of the buffer circuit.

A refresh counter included in row address input circuit/refresh counter RAFK produces a refreshing address that designates a refreshing row, in response to the auto-refresh command or self-refresh command. The count value of the refresh counter is incremented or decremented when the refresh operation is completed.

In response to the read command or write command, column address input circuit CAK accepts, e.g., address bits A0 to A4, i.e., the lower portion of the received address bits, to produce an internal column address signal under the control of command decoder/control circuit CDC. Column address input circuit CAK also includes an address buffer and an address latch.

Row address input circuit/refresh counter RAFK applies the internal row address signal to row pre-decoder RPD, and column address input circuit CAIN applies the internal column address signal to a column pre-decoder CPD.

Row pre-decoder RPD pre-decodes the received internal row address signal to apply the pre-decoded signal to the row decoder included in a row/column decoder band RCDB. Column pre-decoder CPD pre-decodes the internal column address signal received from column address input circuit CAK to apply the pre-decoded signal to the column decoder included in row/column decoder band RCDB.

In response to a command signal, command decoder/control circuit CDC produces an internal control signal for controlling the respective operations of data I/O control circuit DIOK and the pre-amplifier and write driver included in data path band DPB. Depending on the operation mode, command decoder/control circuit CDC outputs control signals such as ACTOR and SELF_REF to a block PHK that is described later. The clock signal CLK is used as a reference signal for determining the internal operation timing of DRAM core MCR.

Data I/O control circuit DIOK conducts data input/output in synchronization with the clock signal CLK. The row address input circuit of row address input circuit/refresh counter RAFK and column address input circuit CAK accept and latch the received address bits in synchronization with the clock signal CLK.

DRAM core MCR further includes block PHK. Block PHK includes an internal voltage generation circuit for generating internal voltages VPP, VCCS, VCCP, VBL and VCP, and a self-refresh timer for activating a refresh request signal FAY at prescribed intervals in response to designation of a self-refresh mode, i.e., in response to the self refresh command SELF_REF from command decoder/control circuit CDC.

The internal voltage VPP is a voltage transmitted onto a selected sub word line SWL and having a voltage level higher than that of a normal operating power-supply voltage. The voltage VCCS is an operating power-supply voltage of the sense amplifier circuits included in sense amplifier bands SB0 to SBn+1, and is produced by a voltage down-converting circuit (not shown). The voltage VCCP, a peripheral power-supply voltage, is an operating power-supply voltage applied to the peripheral circuitry such as row decoder and column decoder included in row/column decoder band RCDB and preamplifier and write driver included in data path band DPB, and is produced by the voltage down-converting circuit (not shown). The voltage VBL is a bit-line pre-charging voltage. The voltage VCP is a cell-plate voltage applied to the cell plate of the memory cell and having a middle voltage level between the H-level and L-level voltages of the memory cell data. Normally, these voltages VBL and VCP are middle voltages equal to the half of the array power-supply voltage (sense power-supply voltage) VCCS.

When the self-refresh command or the auto-refresh command is issued, the refresh counter operates to internally produce a refresh row address. In particular, in the self-refresh mode, the self-refresh timer operates to automatically produce a refresh request signal FAY such that all the rows are sequentially refreshed during the maximum refresh time tREFmax.

Figure 3:
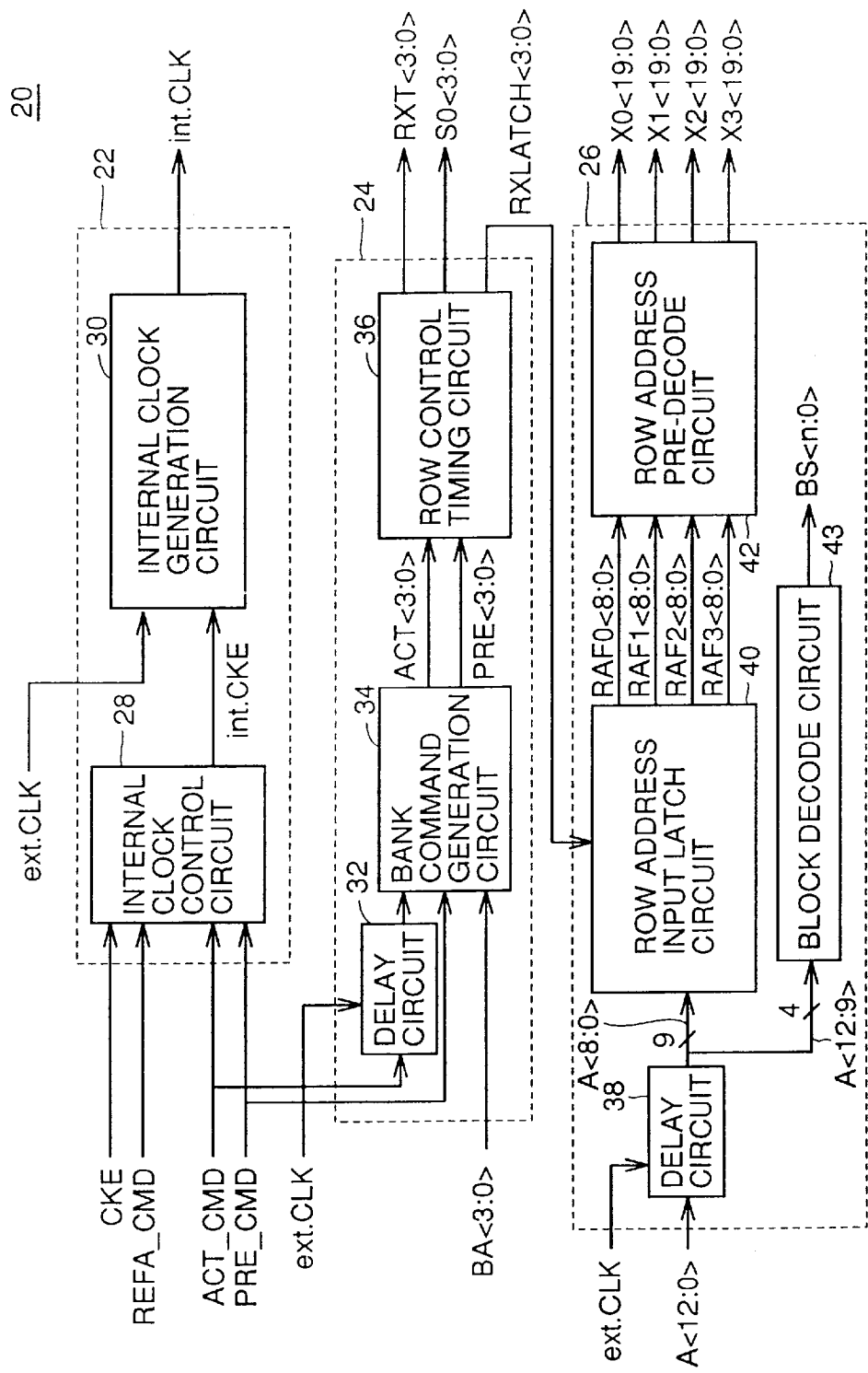
FIG. 3 is a block diagram showing the structure of a control portion 20 associated with clock control and row control in a control signal processing circuit 10 of FIG. 2.

FIG. 3 is a block diagram showing the structure of a control portion 20 associated with clock control and row control in control signal processing circuit 10 of FIG. 2.

For simplification of the description, FIG. 3 does not show the circuit block associated with refresh control. Referring to FIG. 3, control portion 20 includes a clock control circuit 22 for receiving a clock signal ext.CLK and also receiving the clock enable signal CKE and command signals ACT_CMD, PRE_CMD and REFA_CMD from the logic portion and the like to generate an internal clock signal int.CLK, a timing signal generation circuit 24 for generating row timing signals RXT<3:0>, SO<3:0> and RXLATCH<3:0> corresponding to each bank in response to the command signal ACT_CMD and PRE_CMD and a bank selection signal BA<3:0>, and a row address processing circuit 26 for producing pre-decoded signals X0<19:0> to X3<19:0> for output to each bank in response to an address signal A<12:0> and the signal RXLATCH<3:0>. Note that, herein, the number of banks is four by way of example.

Clock control circuit 22 includes an internal clock control circuit 28 for receiving the clock enable signal CKE and command signals ACT_CMD, PRE_CMD and REFA_CMD from the logic portion and the like to output an internal clock enable signal int.CKE, and an internal clock generation circuit 30 for outputting the clock signal ext.CLK as clock signal int.CLK in response to the internal clock enable signal int.CKE.

Timing signal generation circuit 24 includes a delay circuit 32 for delaying the command signal ACT_CMD in synchronization with the clock signal ext.CLK, a bank command generation circuit 34 for outputting command signals ACT<3:0> and PRE<3:0> for each bank according to the bank selection signal BA<3:0> based on the command signal PRE_CMD and the command signal ACT_CMD delayed by delay circuit 32, and a row control timing circuit 36 responsive to the command signals ACT<3:0> and PRE<3:0> for outputting the row control timing signal RXT<3:0> of the main word lines corresponding to the respective banks, the sense-amplifier activation signal SO<3:0> and the signal RXLATCH<3:0> that is activated during the row active period of the selected bank.

Row address processing circuit 26 includes a delay circuit 38 for delaying the address signal A<12:0> in synchronization with the clock signal ext.CLK, a row address input latch circuit 40 for latching the intermediate and lower nine bits of the address signal A<12:0> delayed by delay circuit 38 to output row address signals RAF0<8:0> to RAF3<8:0> corresponding to the respective banks, a row address pre-decode circuit 42 for outputting the pre-decoded signals X0<19:0> to X3<19:0> corresponding to the respective banks in response to the output of row address input latch circuit 40, and a block decode circuit 43 for receiving and decoding an address signal A<12:9> of the address signal A<12:0> delayed by delay circuit 38 to output a block decode signal BS<n:0>.

Figure 4:
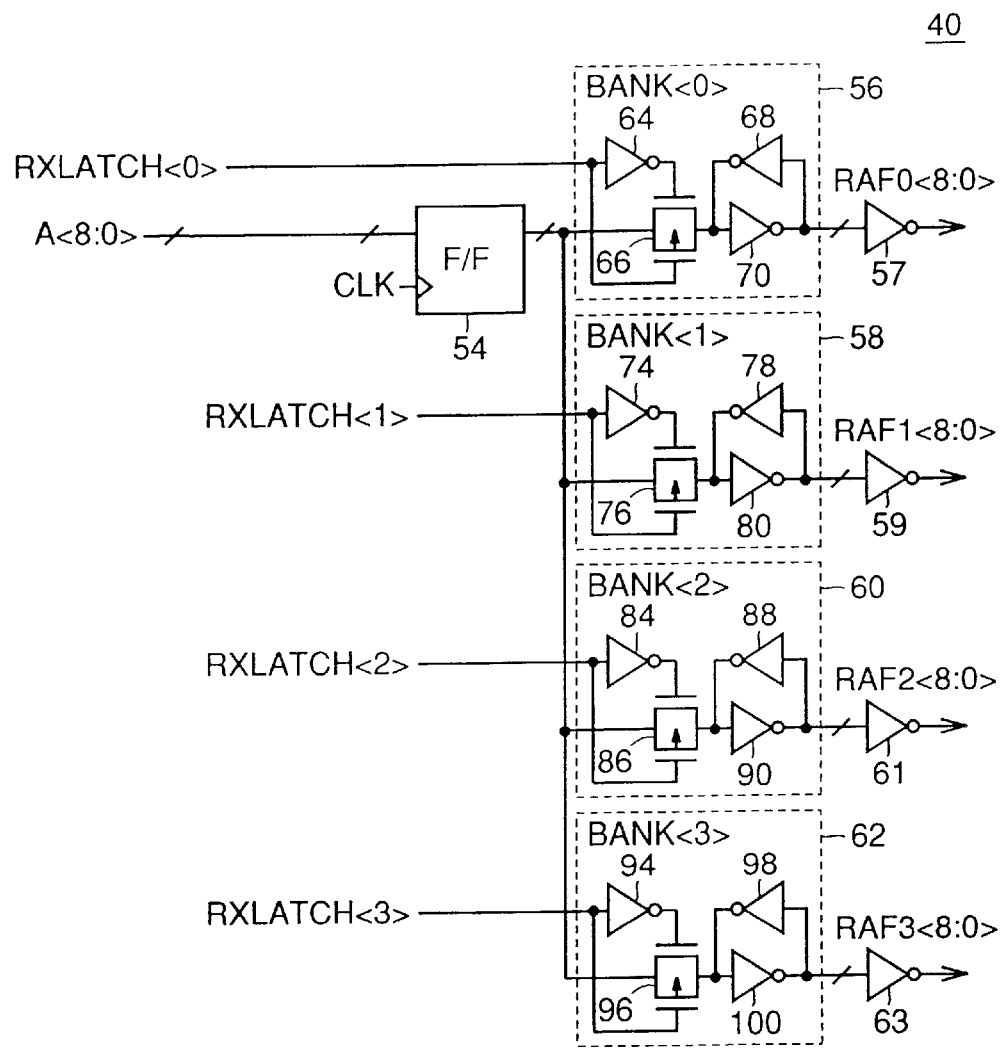
FIG. 4 is a circuit diagram showing the structure of a row address input latch circuit 40 of FIG. 3.

FIG. 4 is a circuit diagram showing the structure of row address input latch circuit 40 of FIG. 3.

Referring to FIG. 4, row address input latch circuit 40 includes a flip-flop 54 for holding the address signal A<8:0> in response to the clock signal CLK, a level latch circuit 56 for accepting and holding the output of flip-flop 54 in response to a signal RXLATCH<0>, a level latch circuit 58 for accepting and holding the output of flip-flop 54 in response to a signal RXLATCH<1>, a level latch circuit 60 for accepting and holding the output of flip-flop 54 in response to a signal RXLATCH<2>, and a level latch circuit 62 for accepting and holding the output of flip-flop 54 in response to a signal RXLATCH<3>.

Row address input latch circuit 40 further includes an inverter 57 receiving the output of level latch circuit 56, an inverter 59 receiving the output of level latch circuit 58, an inverter 61 receiving the output of level latch circuit 60, and an inverter 63 receiving the output of level latch circuit 62.

Level latch circuit 56 includes an inverter 64 for receiving and inverting the signal RXLATCH<0>, a transmission gate 66 for transmitting the output of flip-flop 54 in response to the output of inverter 64 and the signal RXLATCH<0>, an inverter 70 for receiving and inverting the output of flip-flop 54 transmitted from transmission gate 66, and an inverter 68 for receiving and inverting the output of inverter 70 to feed back the inverted output to the input of inverter 70. The row address signal RAF0<8:0> corresponding to bank 0 is output from the output of inverter 57.

Level latch circuit 58 includes an inverter 74 for receiving and inverting the signal RXLATCH<1>, a transmission gate 76 for transmitting the output of flip-flop 54 in response to the output of inverter 74 and the signal RXLATCH<1>, an inverter 80 for receiving and inverting the output of flip-flop 54 transmitted from transmission gate 76, and an inverter 78 for receiving and inverting the output of inverter 80 to feed back the inverted output to the input of inverter 80. The row address signal RAF1<8:0> corresponding to bank 1 is output from the output of inverter 59.

Level latch circuit 60 includes an inverter 84 for receiving and inverting the signal RXLATCH<2>, a transmission gate 86 for transmitting the output of flip-flop 54 in response to the output of inverter 84 and the signal RXLATCH<2>, an inverter 90 for receiving and inverting the output of flip-flop 54 transmitted from transmission gate 86, and an inverter 88 for receiving and inverting the output of inverter 90 to feed back the inverted output to the input of inverter 90. The row address signal RAF2<8:0> corresponding to bank 2 is output from the output of inverter 61.

Level latch circuit 62 includes an inverter 94 for receiving and inverting the signal RXLATCH<3>, a transmission gate 96 for transmitting the output of flip-flop 54 in response to the output of inverter 94 and the signal RXLATCH<3>, an inverter 100 for receiving and inverting the output of flip-flop 54 transmitted from transmission gate 96, and an inverter 98 for receiving and inverting the output of inverter 100 to feed back the inverted output to the input of inverter 100. The row address signal RAF3<8:0> corresponding to bank 3 is output from the output of inverter 63.

The operation of row address input latch circuit 40 will now be described briefly. A row address accepted in flip-flop 54 at the rise of the clock is transmitted to the pre-decode circuit of each bank. When a latch signal RXLATCH<i> for a bank i to be selected (where i is an integer of 0 to 3) is activated in row control timing circuit 36 that is described later, level latch circuit 56 to 62 is operated, so that the address is held during the active period of the signal RXLATCH<i>.

When the pre-decoded signal is produced, the row control timing signals, RXT for the main word line and sub-decode signal and SO for sense amplifier activation are sequentially activated for bank i. Address signals sequentially accepted by flip-flop 54 at the rise of the clock signal continue to be transmitted to the pre-decode circuits of the remaining non-selected banks.

Figure 5:
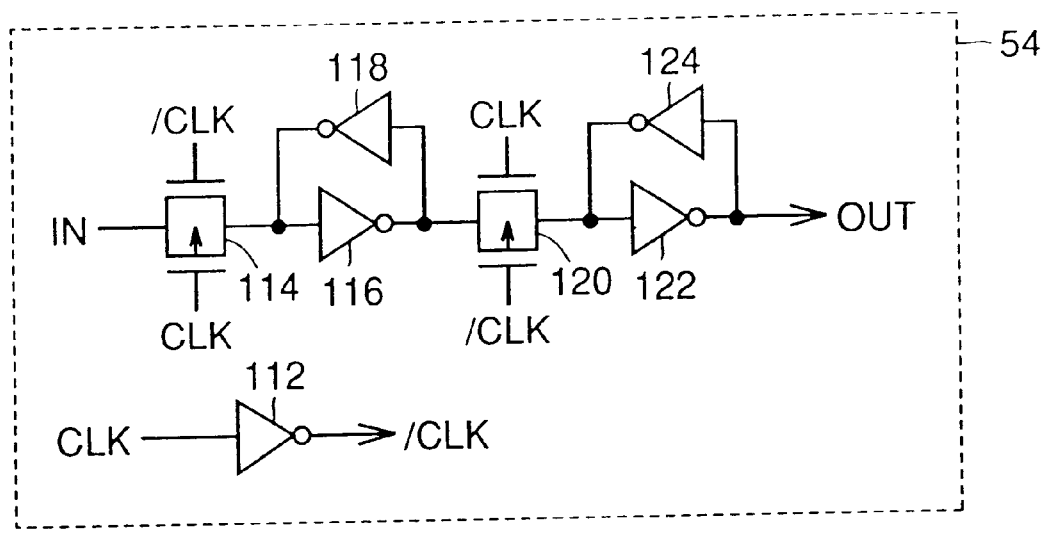
FIG. 5 is a circuit diagram showing the structure of a flip-flop 54 of FIG. 4.

FIG. 5 is a circuit diagram showing the structure of flip-flop 54 of FIG. 4.

Referring to FIG. 5, flip-flop 54 includes an inverter 112 for receiving and inverting the clock signal CLK to output a signal /CLK, a transmission gate 114 for transmitting an input signal IN when the clock signal CLK is at L level and the signal /CLK is at H level, an inverter 116 for receiving and inverting the input signal IN transmitted from transmission gate 114, an inverter 118 for receiving and inverting the signal from inverter 116 to feed back the inverted signal to the input of inverter 116, a transmission gate 120 for transmitting the output of inverter 116 when the clock signal CLK is at H level and the signal /CLK is at L level, an inverter 122 for receiving and inverting the output of inverter 116 transmitted from transmission gate 120 to output an output signal OUT, and an inverter 124 for receiving and inverting the output of inverter 122 to feed back the inverted output to the input of inverter 122.

Figure 6:
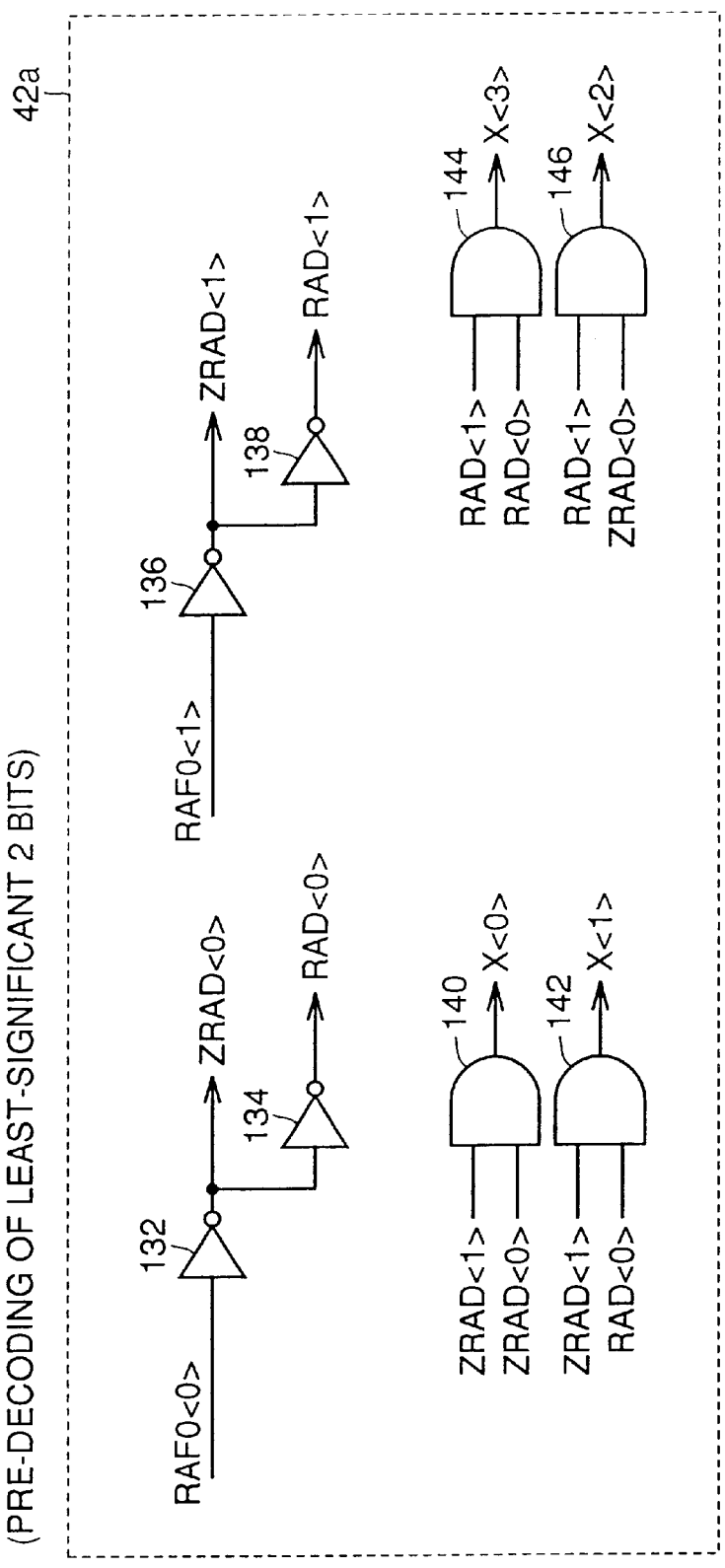
FIG. 6 is a circuit diagram showing the structure of a pre-decode circuit 42a for the least-significant two bits in a row address pre-decode circuit 42 of FIG. 3.

FIG 6 is a circuit diagram showing the structure of a pre-decode circuit 42a for the least significant two bits in row address pre-decode circuit 42 of FIG. 3.

Referring to FIG. 6, pre-decode circuit 42a includes an inverter 132 for receiving and inverting a row address signal RAF0<0> to output a signal ZRAD<0>, an inverter 134 for receiving and inverting the output of inverter 132 to output a signal RAD<0>, an inverter 136 for receiving and inverting a row address signal RAF0<1> to output a signal ZRAD<1>, and an inverter 138 for receiving and inverting the output of inverter 136 to output a signal RAD<1>.

Pre-decode circuit 42a further includes an AND circuit 140 for receiving the signals ZRAD<1> and ZRAD<0> to output a pre-decoded signal X<0>, an AND circuit 142 for receiving the signals ZRAD<1> and RAD<0> to output a pre-decoded signal X<1>, an AND circuit 144 for receiving the signals RAD<1> and RAD<0> to output a pre-decoded signal X<3>, and an AND circuit 146 for receiving the signals RAD<1> and ZRAD<0> to output a pre-decoded signal X<2>.

Figure 7:
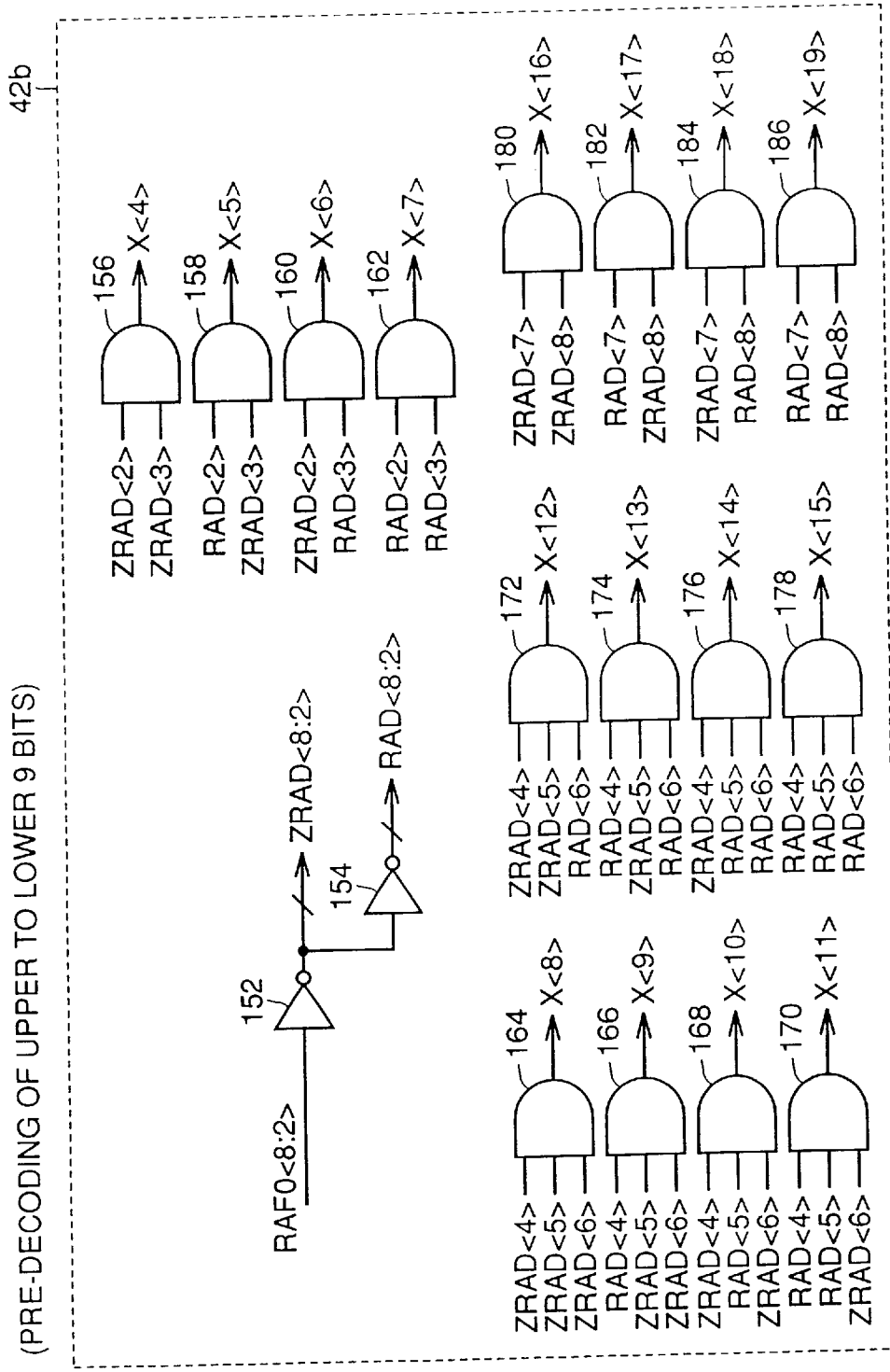
FIG. 7 is a circuit diagram showing the structure of an upper-side pre-decode circuit 42b of row address pre-decode circuit 42 of FIG. 3.

FIG. 7 is a circuit diagram showing the structure of an upper-side pre-decode circuit 42b of row address pre-decode circuit 42 of FIG. 3.

Referring to FIG. 7, pre-decode circuit 42b includes an inverter 152 for receiving and inverting a row address signal RAF0<8:2> to output a signal ZRAD<8:2>, and an inverter 154 for receiving and inverting the output of inverter 152 to output a signal RAD<8:2>.

Pre-decode circuit 42b further includes an AND circuit 156 for receiving signals ZRAD<2> and ZRAD<3> to output a pre-decoded signal X<4>, an AND circuit 158 for receiving signals RAD<2> and ZRAD<3> to output a pre-decoded signal X<5>, an AND circuit 160 for receiving signals ZRAD<2> and RAD<3> to output a pre-decoded signal X<6>, and an AND circuit 162 for receiving signals RAD<2> and RAD<3> to output a pre-decoded signal X<7>.

Pre-decode circuit 42b further includes an AND circuit 164 for receiving signals ZRAD<4>, ZRAD<5> and ZRAD<6> to output a pre-decoded signal X<8>, an AND circuit 166 for receiving signals RAD<4>, ZRAD<5> and ZRAD<6> to output a pre-decoded signal X<9>, an AND circuit 168 for receiving signals ZRAD<4>, RAD<5> and ZRAD<6> to output a pre-decoded signal X<10>, and an AND circuit 170 for receiving signals RAD<4>, RAD<5> and ZRAD<6> to output a pre-decoded signal X<11>.

Pre-decode circuit 42b further includes an AND circuit 172 for receiving signals ZRAD<4>, ZRAD<5> and RAD<6> to output a pre-decoded signal X<12>, an AND circuit 174 for receiving signals RAD<4>, ZRAD<5> and RAD<6> to output a pre-decoded signal X<13>, an AND circuit 176 for receiving signals ZRAD<4>, RAD<5> and RAD<6> to output a pre-decoded signal X<14>, and an AND circuit 178 for receiving signals RAD<4>, RAD<5> and RAD<6> to output a pre-decoded signal X<15>.

Pre-decode circuit 42b further includes an AND circuit 180 for receiving signals ZRAD<7> and ZRAD<8> to output a pre-decoded signal X<16>, an AND circuit 182 for receiving signals RAD<7> and ZRAD<8> to output a pre-decoded signal X<17>, an AND circuit 184 for receiving signals ZRAD<7> and RAD<8> to output a pre-decoded signal X<18>, and an AND circuit 186 for receiving signals RAD<7> and RAD<8> to output a pre-decoded signal X<19>.

Although not shown in the figure, the most significant addresses A9 to A12 are decoded separately for use in production of a bank selection signal BA<3:0> for selecting memory array 0 to n and a block decode signal BS<n:0>.

Figure 8:
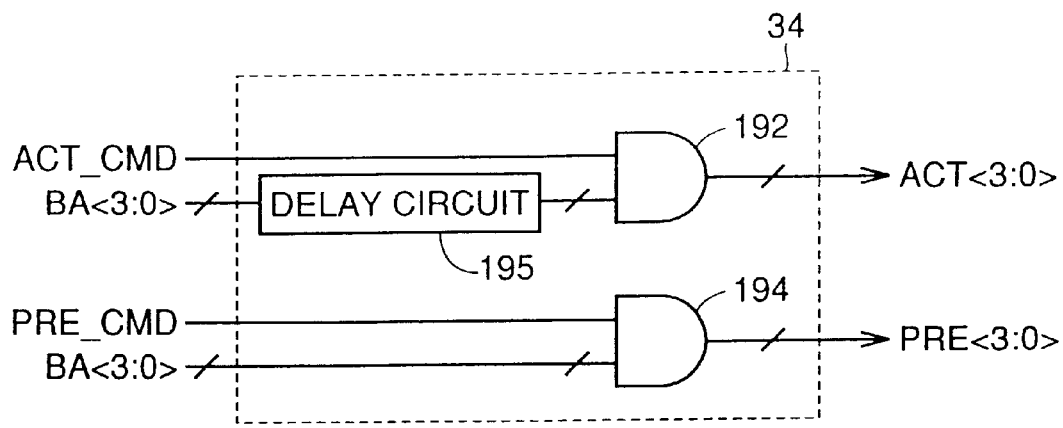
FIG. 8 is a circuit diagram showing the structure of a bank command generation circuit 34 of FIG. 3.

FIG. 8 is a circuit diagram showing the structure of bank command generation circuit 34 of FIG. 3.

Referring to FIG. 8, bank command generation circuit 34 includes an AND circuit 192 for receiving the command signal ACT_CMD and the bank selection signal BA<3:0> applied through a delay circuit 195 for delaying the bank selection signal BA<3:0> in synchronization with the clock signal ext.CLK to output the command signal ACT<3:0> for each bank, and an AND circuit 194 for receiving the command signal PRE_CMD and bank selection signal BA<3:0> to output the command signal PRE<3:0> for each bank.

Figure 9:
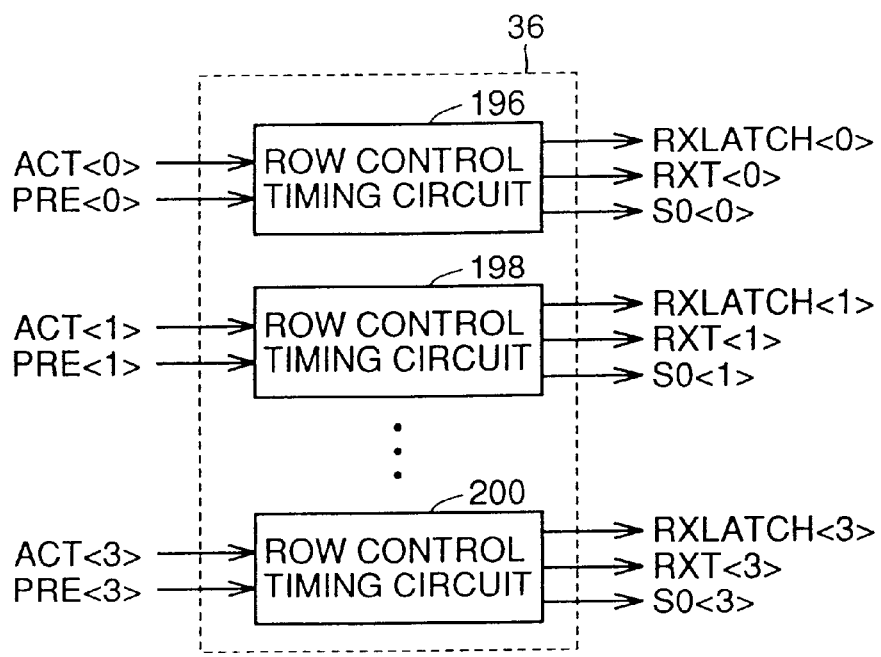
FIG. 9 is a block diagram showing the structure of a row control timing circuit 36 of FIG. 3.

FIG. 9 is a block diagram showing the structure of row control timing circuit 36 of FIG. 3.

Referring to FIG. 9, row control timing circuit 36 includes a row control timing circuit 196 for receiving command signals ACT<0> and PRE<0> to output signals RXLATCH<0>, RXT<0> and SO<0>, a row control timing circuit 198 for receiving command signals ACT<1> and PRE<1> to output signals RXLATCH<1>, RXT<1> and SO<1>, and a row control timing circuit 200 for receiving command signals ACT<3> and PRE<3> to output signals RXLATCH<3>, RXT<3> and SO<3>.

Figure 10:
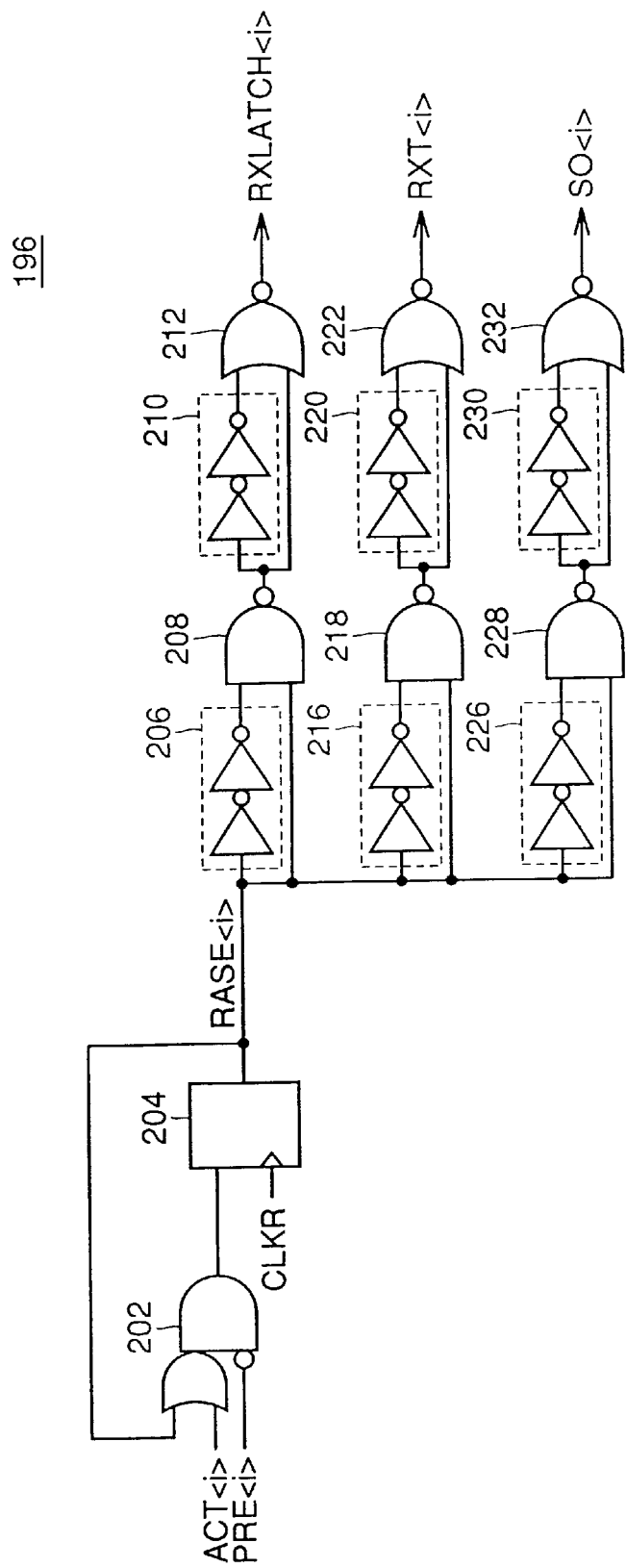
FIG. 10 is a circuit diagram showing the structure of a row control timing circuit 196 of FIG. 9.

FIG. 10 is a circuit diagram showing the structure of row control timing circuit 196 of FIG. 9.

Referring to FIG. 10, row control timing circuit 196 includes a composite gate 202 for receiving signals ACT<i>, RASE<i> and PRE<i>, and a flip-flop 204 for accepting the output of composite gate 202 in response to a row control clock signal CLKR to output the signal RASE<i>. Composite gate 202 obtains a logical sum of the signals ACT<i> and RASE<i>, and outputs a logical product of the logical sum and the inverted value of the signal PRE<i>. Note that the signal RASE<i> is a signal that is held at H level while the corresponding bank is active.

Row control timing circuit 196 further includes a delay circuit 206 for receiving and delaying the signal RASE<i>, a NAND circuit 208 for receiving the signal RASE<i> and the output of delay circuit 206, a delay circuit 210 for receiving and delaying the output of NAND circuit 208, and a NOR circuit 212 for receiving the respective outputs of NAND circuit 208 and delay circuit 210 to output a signal RXLATCH<i>.

Row control timing circuit 196 further includes a delay circuit 216 for receiving and delaying the signal RASE<i>, a NAND circuit 218 for receiving the signal RASE<i> and the output of delay circuit 216, a delay circuit 220 for receiving and delaying the output of NAND circuit 218, and a NOR circuit 222 for receiving the respective outputs of NAND circuit 218 and delay circuit 220 to output a signal RXT<i>.

Row control timing circuit 196 further includes a delay circuit 226 for receiving and delaying the signal RASE<i>, a NAND circuit 228 for receiving the signal RASE<i> and the output of delay circuit 226, a delay circuit 230 for receiving and delaying the output of NAND circuit 228, and a NOR circuit 232 for receiving the respective outputs of NAND circuit 228 and delay circuit 230 to output a sense amplifier activation signal SO<i>.

Each of delay circuits 206, 210, 216, 220, 226 and 230 includes an even number of inverter stages connected in series. The delay time of each delay circuit is set to a different value according to the delay time and activation time from the time the signal RASE<i> is activated until the signal RXLATCH<i>, RXT<i>, SO<i> is activated.

Note that, in FIG. 10, the letter "i" denotes the bank number 0 to 3, and "i" is zero when it denotes row control timing circuit 196. Since row control timing circuits 198 to 200 of FIG. 9 have the same structure as that of row control timing circuit 196 (the letter "i" of FIG. 10 need only be replaced with the corresponding bank number), description thereof is not repeated.

Figure 11:
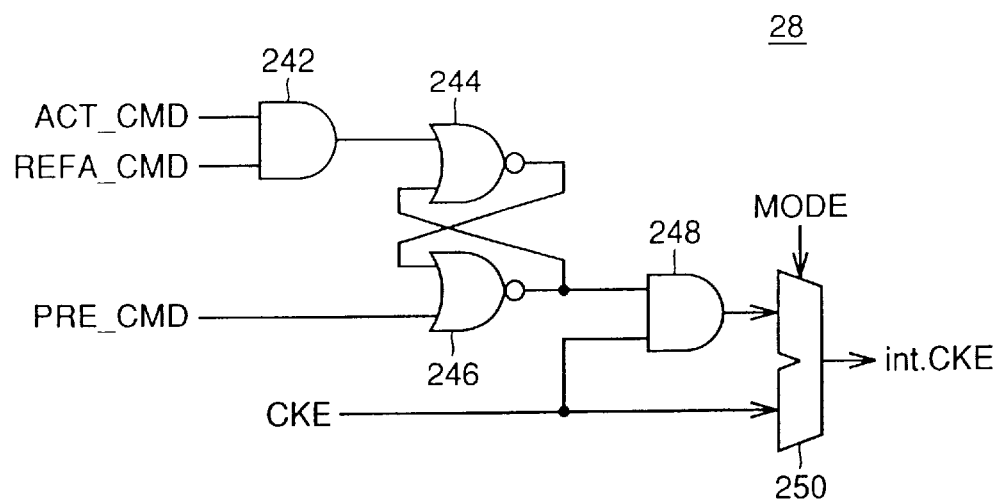
FIG. 11 is a circuit diagram showing the structure of an internal clock control circuit 28 of FIG. 3.

FIG. 11 is a circuit diagram showing the structure of internal clock control circuit 28 of FIG. 3.

Referring to FIG. 11, internal clock control circuit 28 includes an AND circuit 242 for receiving the command signals ACT_CMD and REFA_CMD, a NOR circuit 244 for receiving the output of AND circuit 242 at its one input, a NOR circuit 246 for receiving the command signal PRE_CMD and the output of NOR circuit 244, and an AND circuit 248 for receiving the output of NOR circuit 246 and the clock enable signal CKE. NOR circuit 244 receives the output of NOR circuit 246 at the other input.

Internal clock control circuit 28 further includes a selection gate 250 for outputting either the clock enable signal CKE or the output of AND circuit 248 as signal int.CKE in response to a mode signal MODE.

Figure 12:
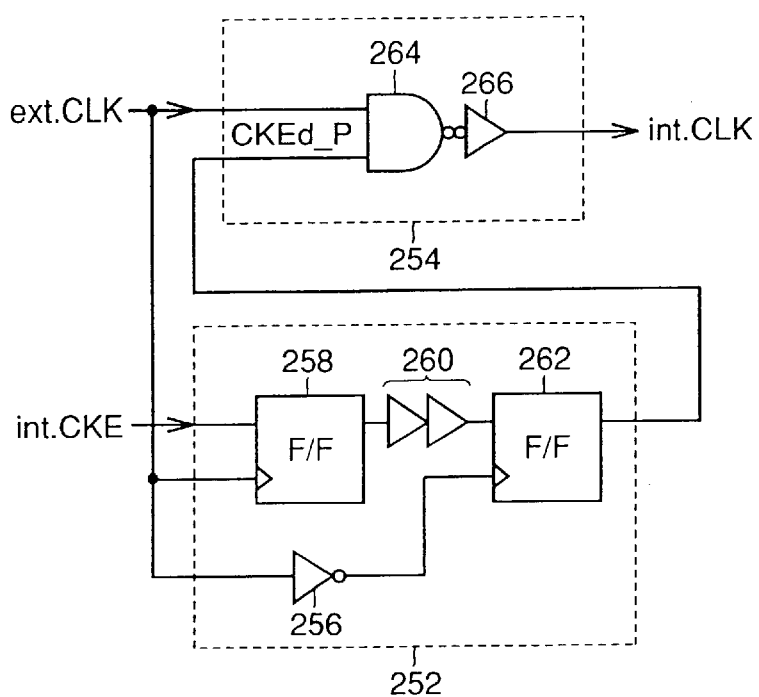
FIG. 12 is a circuit diagram showing the structure of an internal clock generation circuit 30 of FIG. 3.

FIG. 12 is a circuit diagram showing the structure of internal clock generation circuit 30 of FIG. 3.

Referring to FIG. 12, internal clock generation circuit 30 includes a CKE control circuit 252 for accepting the clock enable signal int.CKE in response to the external clock signal ext.CLK to output a clock control signal CKEd_P, and a gate circuit 254 for outputting the external clock signal ext.CLK as internal clock signal int.CLK in response to the clock control signal CKEd_P.

CKE control circuit 252 includes an inverter 256 for receiving and inverting the external clock signal ext.CLK, a flip-flop 258 for accepting the clock enable signal int.CKE in response to the external clock signal ext.CLK, a buffer circuit 260 for buffering the output of flip-flop 258, and a flip-flop 262 for accepting the output of buffer circuit 260 in response to the output of inverter 256.

Gate circuit 254 includes a NAND circuit 264 for receiving the external clock signal ext.CLK and the clock control signal CKEd_P, and an inverter 266 for receiving and inverting the output of NAND circuit 264 to output the internal clock signal int.CLK.

Figure 13:
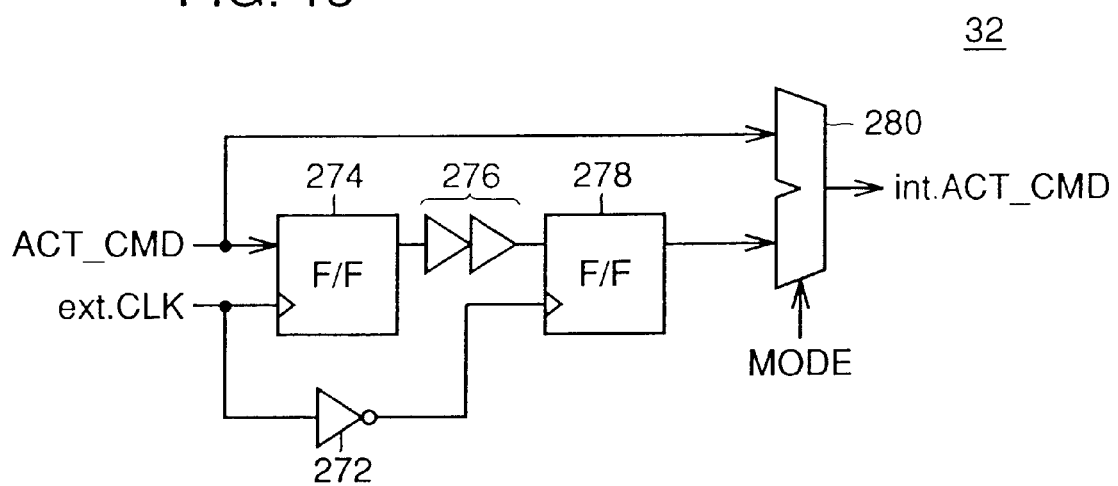
FIG. 13 is a circuit diagram showing the structure of a delay circuit 32 of FIG. 3.

FIG. 13 is a circuit diagram showing the structure of delay circuit 32 of FIG. 3.

Referring to FIG. 13, delay circuit 32 includes a flip-flop 274 for accepting the command signal ACT_CMD in response to the clock signal ext.CLK, a buffer circuit 276 for buffering the output of flip-flop 274, an inverter 272 for receiving and inverting the clock signal ext.CLK, a flip-flop 278 for accepting the output of buffer circuit 276 in response to the output of inverter 272, and a selection gate 280 for outputting either the command signal ACT_CMD or the output of flip-flop 278 as internal command signal int.ACT_CMD in response to the mode signal MODE.

Note that, since delay circuit 38 of FIG. 3 has the same structure as that of delay circuit 32, description thereof is not repeated.

Hereinafter, control of the internal clock signal int.CLK according to the first embodiment is described.

The DRAM core is designed such that a delay time tRCD (Row to Column Delay) from row activation to column activation corresponds to two clocks or less when the clock at the maximum operating frequency is input. More specifically, when a row active command ACT is input, a sensing operation of the sense amplifier for the selected row is completed, and a read command READ can be input at the second clock after the input of row active command ACT. Accordingly, with the operation speed of the array being the same, delay time tRCD corresponding to one clock can be realized by reducing the frequency of the input clock to a value lower than the maximum operating frequency.

In the case where the system LSI is used in the low power consumption mode by applying the clock signal to the DRAM core at a reduced frequency corresponding to one-clock delay time tRCD, the mode signal MODE of FIG. 11 is activated.

When the clock enable signal CKE is active, the internal signal int.CLK is activated in internal clock control circuit 28 in response to input of the command signal ACT_CMD or REFA_CMD to the DRAM core. The signal int.CLK is deactivated when the command signal PRE_CMD is externally applied to the DRAM core. Even when the signal int.CKE is activated, the generation timing of the internal clock signal int.CLK is delayed in the internal clock generation circuit. Therefore, the command signal and the address signal are delayed by delay circuits 32 and 38 of FIG. 3 so that the operation for the memory array is conducted normally with the internal clock signal int.CLK.

More specifically, when the mode signal MODE is active, delay circuit 32 generates an internal row active command signal int.ACT_CMD delayed by one clock with respect to the command signal ACT_CMD. Like the row active command, delay circuit 38 delays the address signal A<12:0> by one clock for input to row address input latch circuit 40. Accordingly, in the memory array of the DRAM core, the operation is conducted with delay time tRCD corresponding to one clock of the clock signal.

When the mode signal MODE is inactive, the clock enable signal CKE is directly transmitted as signal int.CKE. Therefore, like the conventional example, internal clock generation circuit 30 is controlled by the clock enable signal CKE.

Figure 14:
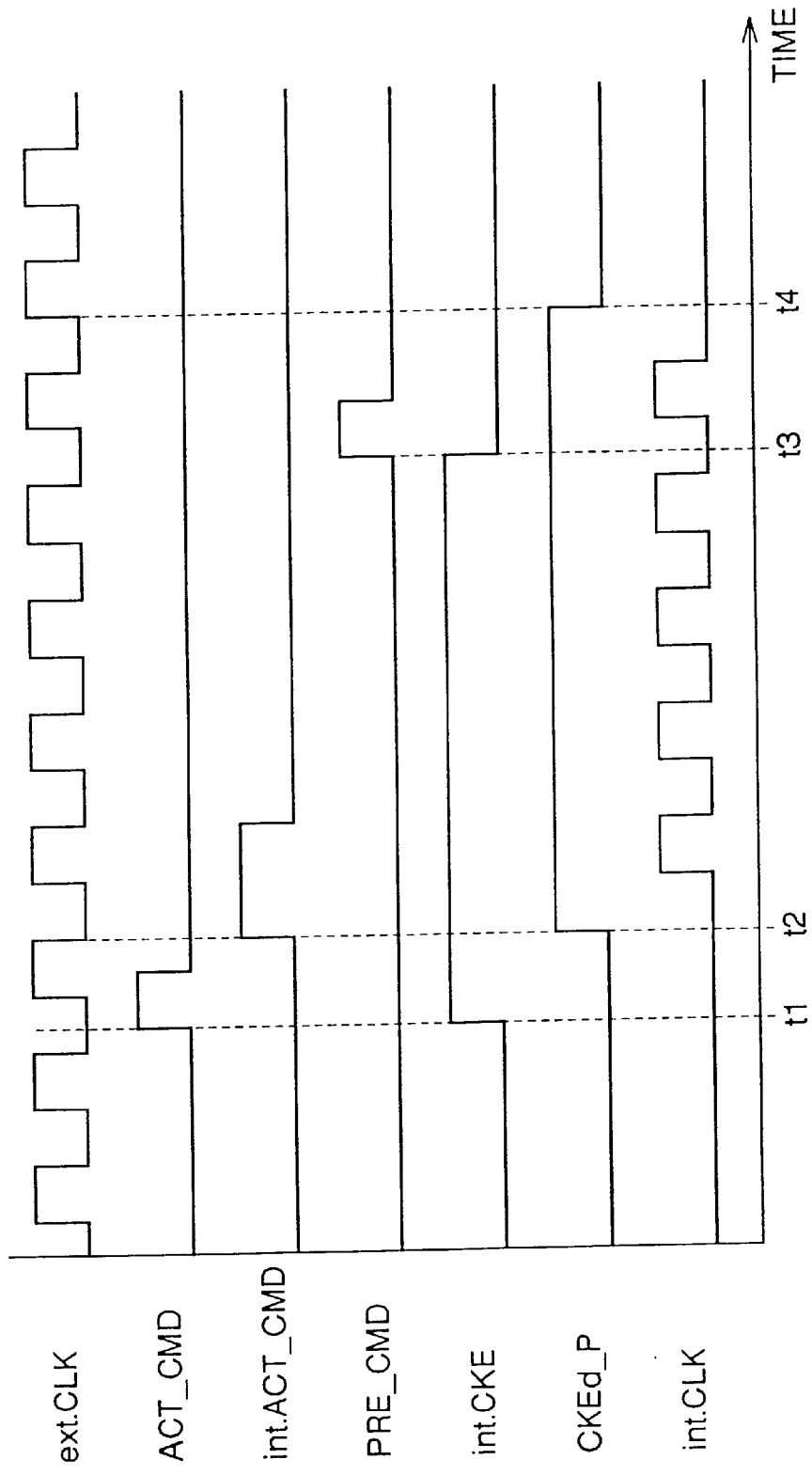
FIG. 14 is an operation waveform chart illustrating control of an internal clock signal int.CLK according to a first embodiment.

FIG. 14 is an operation waveform chart illustrating control of the internal clock signal int.CLK according to the first embodiment.

Referring to FIG. 14, it is now assumed that the external clock signal ext.CLK has been input and the external clock enable signal CKE has been activated to H level. In this state, the internal clock enable signal int.CKE has been deactivated to L level in the case where no command is input.

In response to application of the command signal ACT_CMD at time t1, internal clock control circuit 28 of FIG. 11 activates the signal int.CKE.

Then, at time t2, delay circuit 32 delays the command signal ACT_CMD for transmission to bank command generation circuit 34. CKE control circuit 252 of FIG. 12 also delays the signal int.CKE and outputs the signal CKEd_P. In response to activation of the signal CKEd_P, the external clock signal ext.CLK is transmitted as internal clock signal int.CLK to the activated bank.

Thereafter, in response to application of the pre-charge command PRE_CMD at time t3, internal clock control circuit 28 of FIG. 11 deactivates the signal int.CKE, which in turn is delayed by CKE control circuit 252 of FIG. 12, whereby the signal CKEd_P falls at time t4. The internal clock signal int.CLK is held inactive from time t4.

As has been described above, according to the first embodiment, the clock suspend state is terminated and the internal clock signal int.CLK is generated in response to input of the row active command. The clock suspend state in which no internal clock is generated is resumed in response to input of the pre-charge command. As a result, the standby current can be significantly reduced as compared to the conventional example.

[Modification of First Embodiment]

Figure 15:
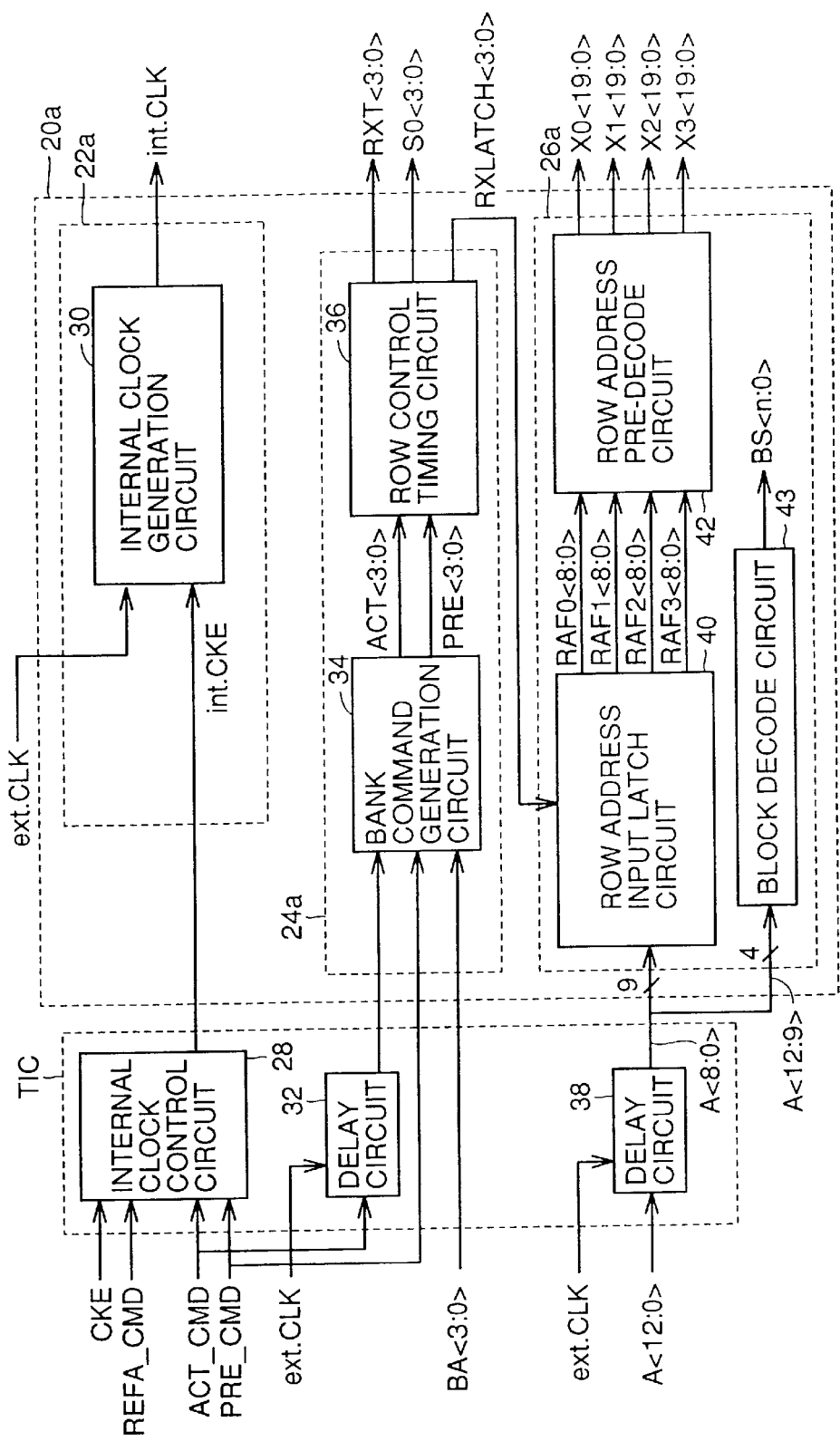
FIG. 15 is a block diagram showing the structure of a control portion 20a associated with clock control and row control and a test interface circuit TIC according to a modification of the first embodiment.

FIG. 15 is a block diagram showing the structure of a control circuit 20a associated with clock control and row control and a test interface circuit TIC according to a modification of the first embodiment.

Referring to FIG. 15, control circuit 20a includes a clock control circuit 22a, a timing signal generation circuit 24a and a row address processing circuit 26a, instead of clock control circuit 22, timing signal generation circuit 24 and row address processing circuit 26 in the structure of control portion 20 shown in FIG. 3.

Clock control circuit 22a is different from clock control circuit 22 in that clock control circuit 22a includes internal clock generation circuit 30, but does not include internal clock control circuit 28. Internal clock control circuit 28 is included in test interface circuit TIC shown in FIG. 1.

Timing signal generation circuit 24a is different from timing signal generation circuit 24 in that timing signal generation circuit 24a includes bank command generation circuit 34 and row control timing circuit 36, but does not include delay circuit 32. Delay circuit 32 is included in test interface circuit TIC shown in FIG. 1.

Row address processing circuit 26a is different from row address processing circuit 26 in that row address processing circuit 26a includes row address input latch circuit 40 and row address pre-decode circuit 42, but does not include delay circuit 38. Delay circuit 38 is included in test interface circuit TIC shown in FIG. 1.

Note that, although not shown in the figure, test interface circuit TIC includes circuitry such as a signal switching circuit in addition to internal control circuit 28 and delay circuits 32 and 38 so that a test signal can be externally input to the DRAM core.

Referring back to FIG. 1, the system LSI is developed by using a circuit block having a specific function such as DRAM core MCR, analog core ACR and a microprocessor (not shown), and large-scale logic LG including logic circuitry for implementing a function as required by individual customers, and also by using a circuit block including test interface circuit TIC for facilitating testing of these circuit blocks. Since the circuit block having a specific function is used for general purpose, it is registered with a library.

After considering the way to simplify the wiring for interconnecting these circuit blocks and determining arrangement of the circuit blocks, they are interconnected by using an interconnection region, i.e., a clearance between the circuit blocks. These arranging and interconnecting steps are often conducted by computer automatically.

Figure 23:
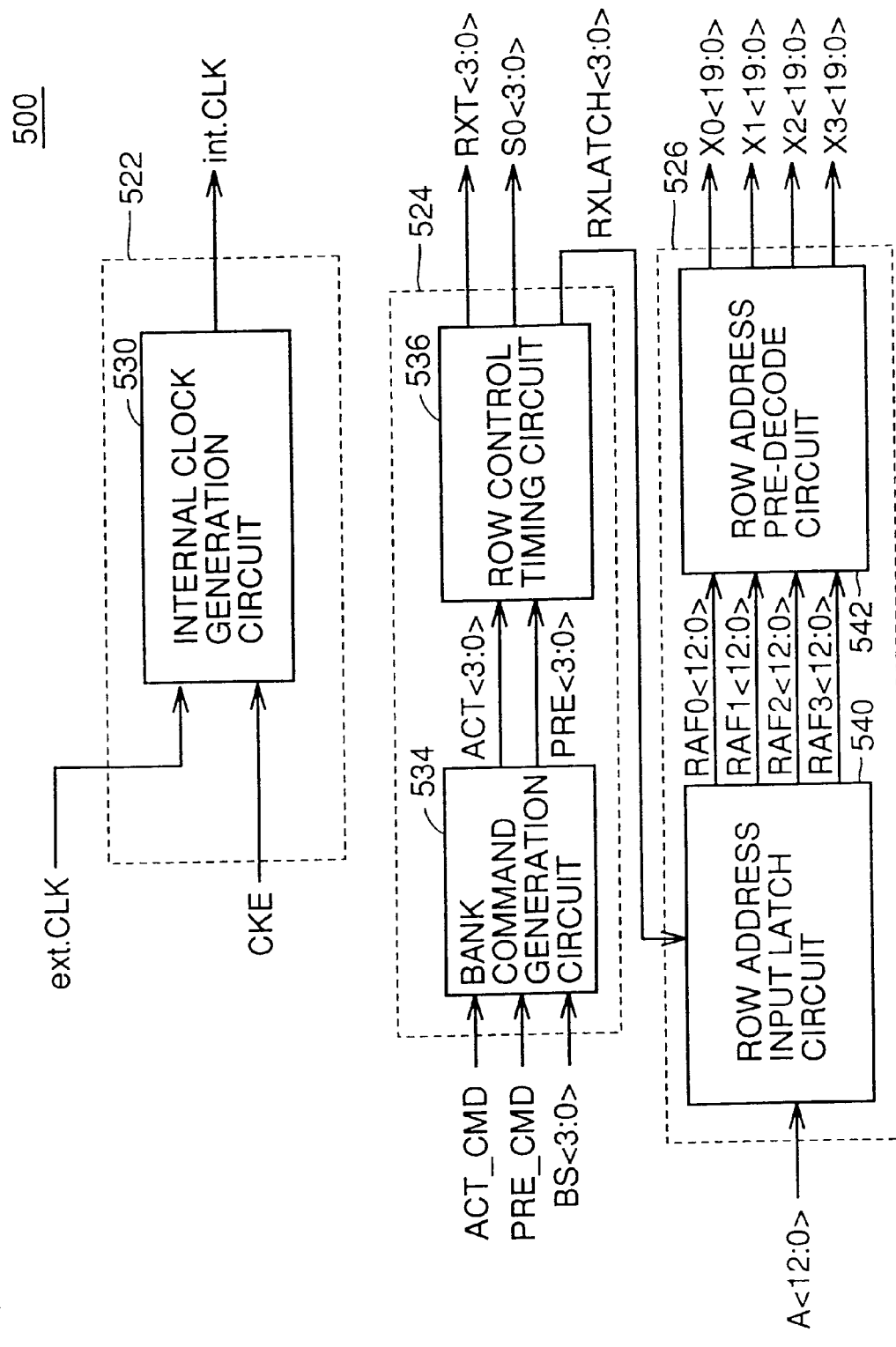
FIG. 23 is a block diagram showing the structure of a control portion 500 associated with command generation and row control in a DRAM core.
Figure 24:
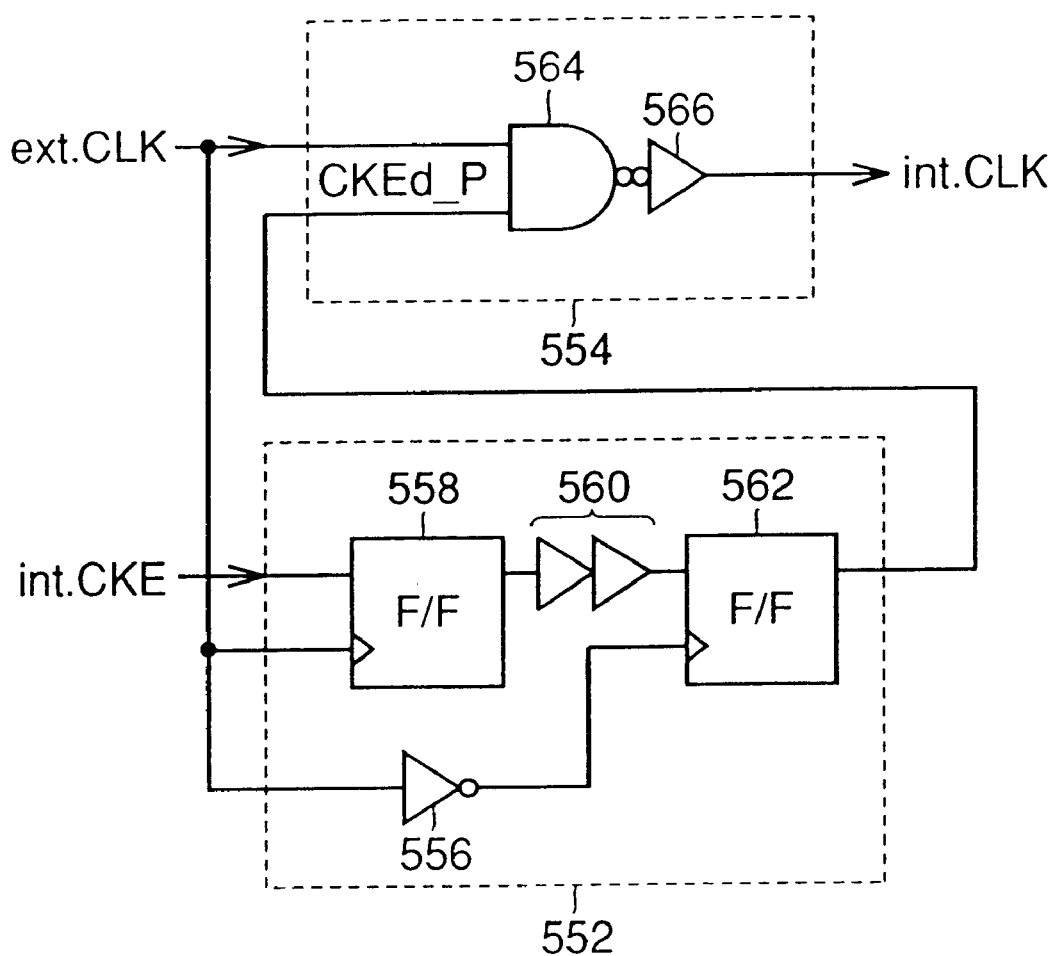
FIG. 24 is a circuit diagram showing the structure of an internal clock generation circuit 530 of FIG. 23.
Figure 25:
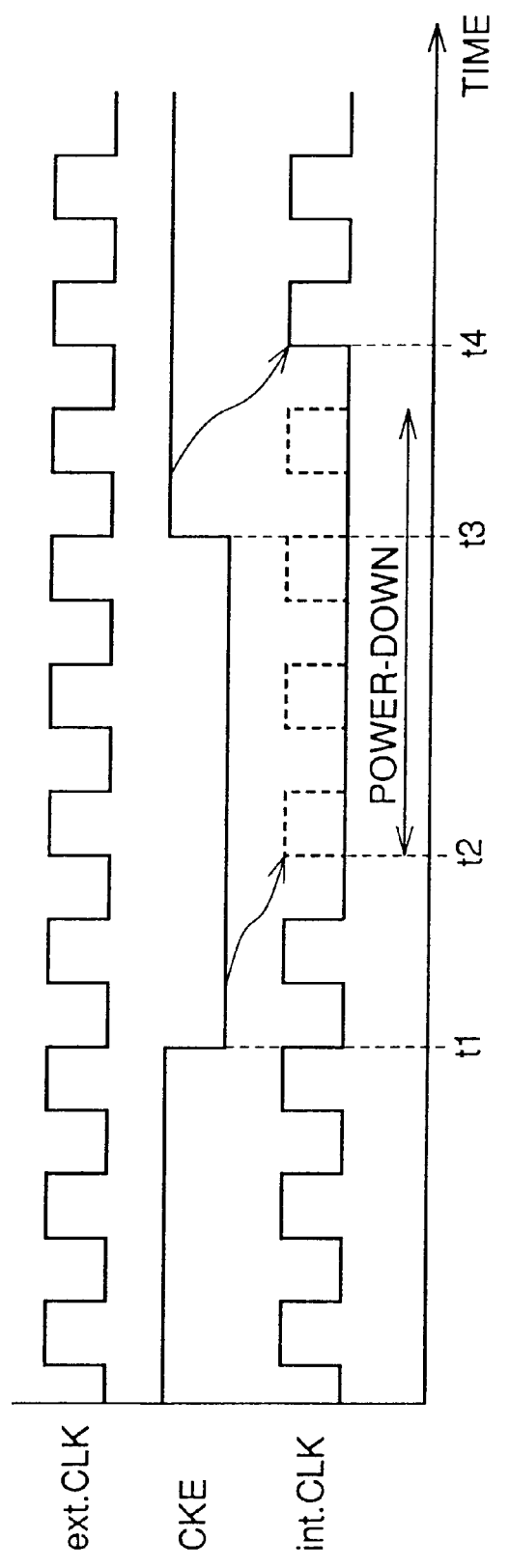
FIG. 25 is an operation waveform chart illustrating a clock suspend function.

Such a structure as shown in FIG. 15 allows control portion 20a to have the same structure as that of control portion 500 shown in FIG. 23. More specifically, by adding to the test interface circuit a component such as a latch circuit for shifting the latency of an internal ACT signal and a row address, the same effects as those of the first embodiment can be obtained without changing the structure of the control portion included in the conventional DRAM core. In other words, since the DRAM core need not be changed, a DRAM core of the library that is common to a high-speed system LSI and a system LSI that requires a power-down function can be used.

[Second Embodiment]

Figure 16:
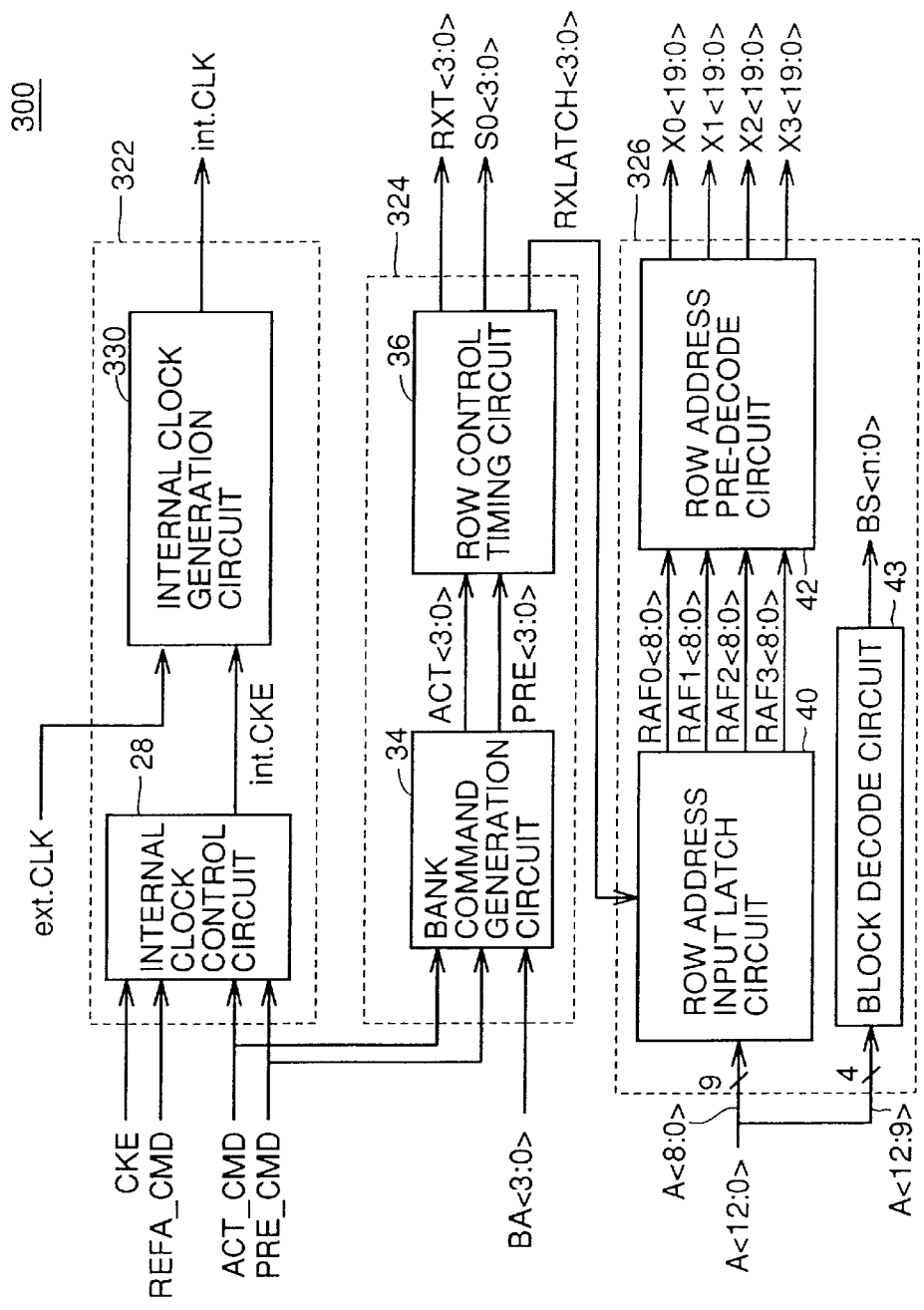
FIG. 16 is a block diagram showing the structure of a control portion 300 according to a second embodiment.

FIG. 16 is a block diagram showing the structure of a control portion 300 according to the second embodiment.

Referring to FIG. 16, control portion 300 includes a clock control circuit 322, a timing signal generation circuit 324 and a row address processing circuit 326, instead of clock control circuit 22, timing signal generation circuit 24 and row address processing circuit 26 in the structure of control portion 20 shown in FIG. 3.

Clock control circuit 322 is different from clock control circuit 22 shown in FIG. 3 in that clock control circuit 322 includes an internal clock generation circuit 330 instead of internal clock generation circuit 30 in clock control circuit 22.

Timing signal generation circuit 324 is different from timing signal generation circuit 24 shown in FIG. 3 in that the command signal ACT_CMD is applied directly to bank command generation circuit 34 without passing through delay circuit 32 of timing signal generation circuit 24.

Row address processing circuit 326 is different from row address processing circuit 26 shown in FIG. 3 in that the address signal A<12:0> is applied directly to row address input latch circuit 40 and block decode circuit 43 without passing through delay circuit 38 of row address processing circuit 26. Since the structure of control portion 300 is otherwise the same as that of control portion 20 shown in FIG. 3, description thereof is not repeated.

Figure 17:
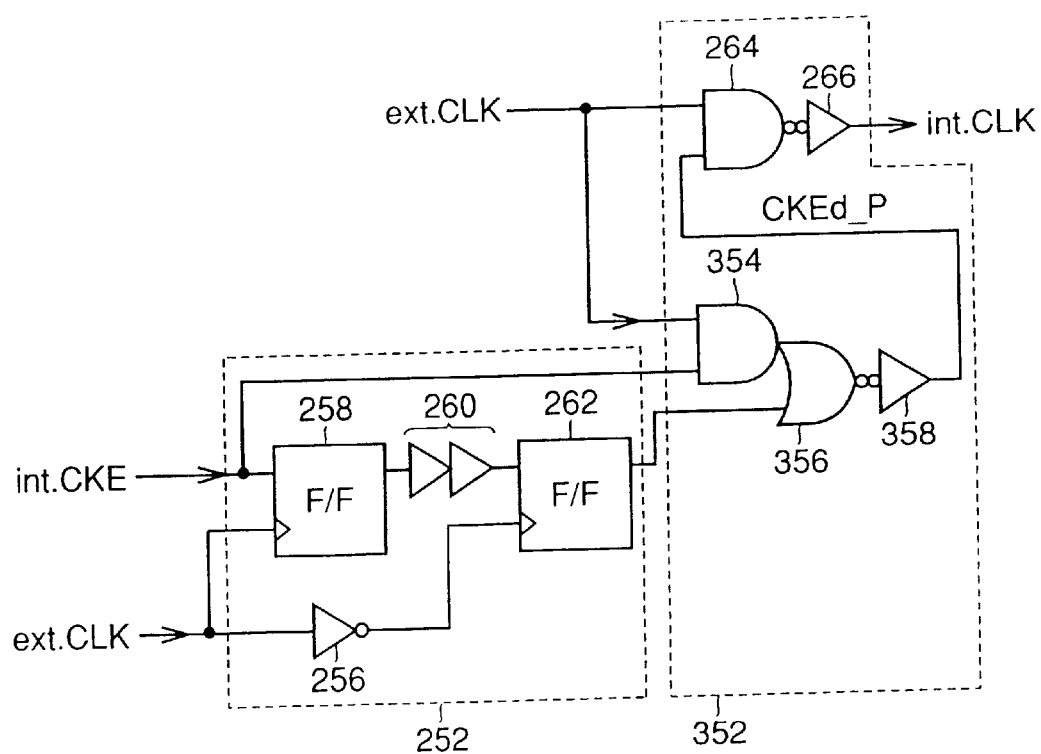
FIG. 17 is a circuit diagram showing the structure of an internal clock generation circuit 330 of FIG. 16.

FIG. 17 is a circuit diagram showing the structure of internal clock generation circuit 330 shown in FIG. 16.

Referring to FIG. 17, internal clock generation circuit 330 is different from internal clock generation circuit 30 shown in FIG. 12 in that internal clock generation circuit 330 includes a gate circuit 352 instead of gate circuit 254 in internal clock generation circuit 30.

Gate circuit 352 is different from gate circuit 254 shown in FIG. 12 in that gate circuit 352 include, in addition to the structure of gate circuit 254, an AND circuit 354 for receiving the external clock signal ext.CLK and the signal int.CKE, a NOR circuit 356 for receiving the respective outputs of AND circuit 354 and flip-flop 262, and an inverter 358 for receiving and inverting the output of NOR circuit 356 to output the signal CKEd_P. Since the structure of internal clock generation circuit 330 is otherwise the same as that of internal clock generation circuit 30 shown in FIG. 12, description thereof is not repeated.

Figure 18:
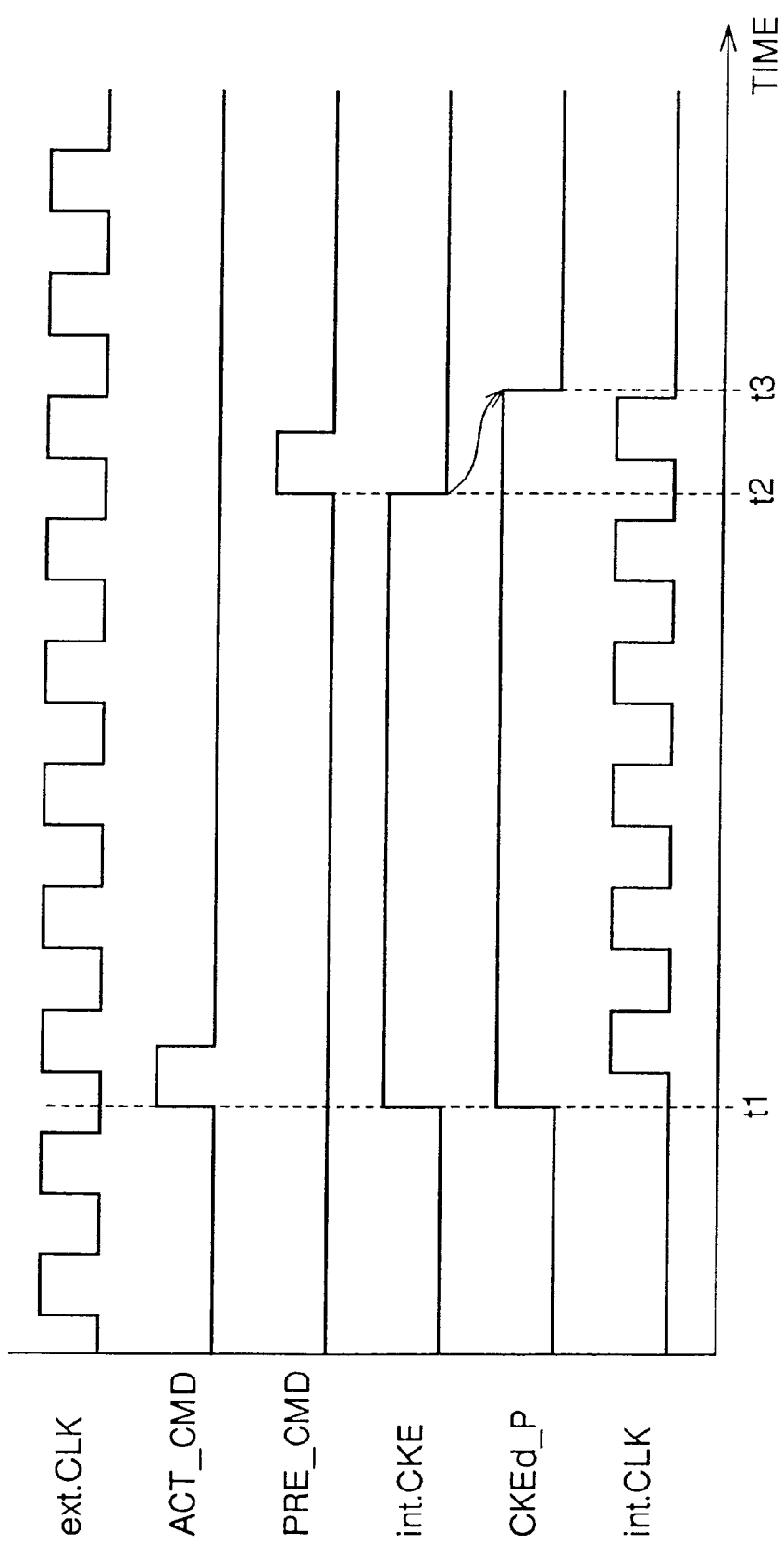
FIG. 18 is an operation waveform chart illustrating control of an internal clock signal int.CLK according to the second embodiment.

FIG. 18 is an operation waveform chart illustrating control of the internal clock signal int.CLK according to the second embodiment.

Referring to FIG. 18, in response to application of the command signal ACT_CMD at time t1, internal clock generation circuit 330 shown in FIG. 17 immediately activates the signal CKEd_P. Since the clock signal int.CLK is thus generated from time t1, the command signal and the address signal need not be delayed.

In response to input of the pre-charge command at time t2, the signal int.CKE is deactivated to L level, but flip-flops 258 and 262 shown in FIG. 17 cause the signal CKEd_P to be deactivated in synchronization with the fall of the external clock signal ext.CLK at time t3. Accordingly, the clock signal int.CLK is held inactive from time t3.

In other words, by activating the signal CKEd_P for internal clock generation during the set-up period of the external row active command for the external clock, the internal clock int.CLK can be resumed without being delayed by one clock.

Accordingly, even when the external clock at the maximum operating frequency is used, delay time tRCD corresponding to two clocks is assured in the internal operation of the memory array. As a result, the operating frequency can be increased even in the low power consumption mode.

[Third Embodiment]

In the third embodiment, reduction in power consumption in the case of the multi-bank structure is further considered.

Figure 19:
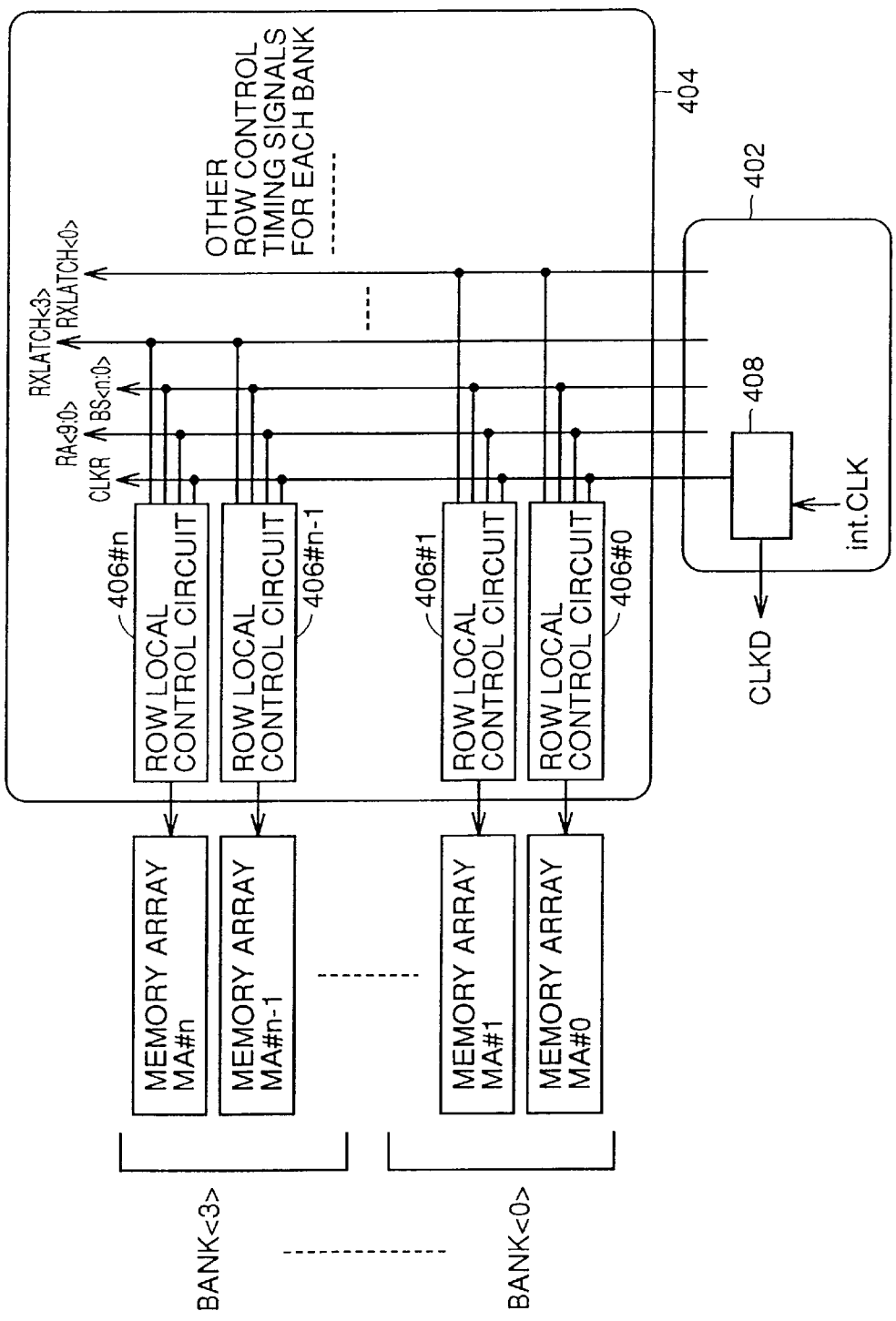
FIG. 19 is a schematic block diagram showing the structure of a DRAM core in the case of the multi-bank structure.

FIG. 19 is a schematic block diagram showing the structure of a DRAM core in the case of the multi-bank structure.

Referring to FIG. 19, a clock generation circuit 408 for outputting a data bus control clock signal CLKD and a row control clock signal CLKR in response to the internal clock signal int.CLK is provided in a central control block 402.

Row local control circuits 406#0 to 406#n corresponding to respective memory arrays MA#0 to MA#n are provided in a region 404 called a backbone band. A signal line group is provided for transmitting a row address signal RA<9:0> and a block decode signal BS<n:0> that are transmitted in common to row local control circuits 406#0 to 406#n, and a signal RXLATCH<3:0> applied to row local control circuits 406 corresponding to each bank.

Each bank includes a plurality of memory arrays. For example, in FIG. 19, memory arrays #MA0 and #MA1 are provided corresponding to bank <0>.

Figure 20:
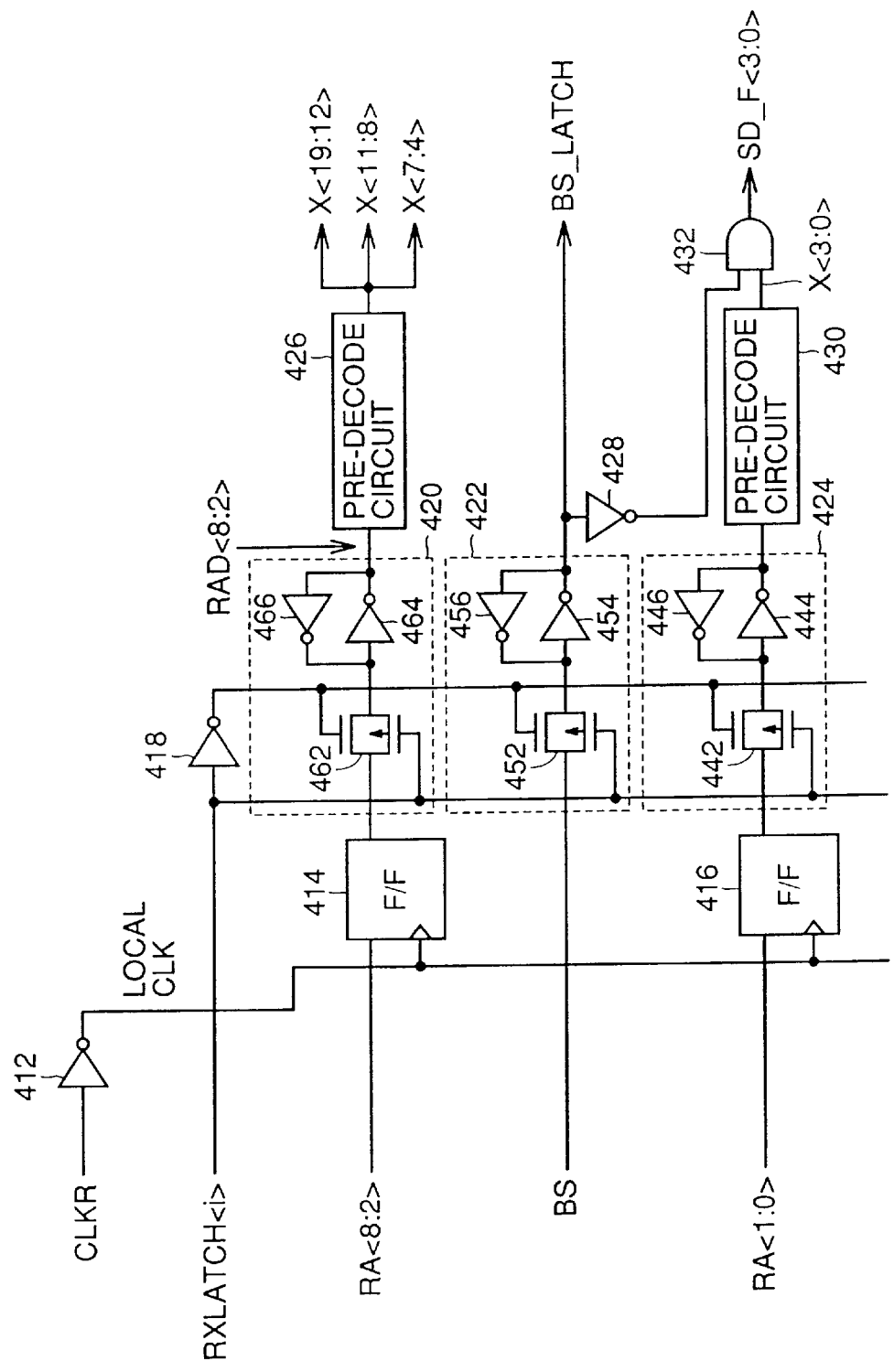
FIG. 20 is a circuit diagram showing the structure of a row local control circuit 406 corresponding to bank <i>.

FIG. 20 is a circuit diagram showing the structure of row local control circuit 406 corresponding to bank <i>.

Referring to FIG. 20, row local control circuit 406 includes an inverter 412 for receiving and inverting a row control clock signal CLKR to output a local clock, a flip-flop 414 for receiving and holding a row address signal RA<8:2> in response to the local clock, a flip-flop 416 for receiving and holding a row address signal RA<1:0> in response to the local clock, an inverter 418 for receiving and inverting a signal RXLATCH<i>, a level latch circuit 420 for latching the output of flip-flop 414 in response to the signal RXLATCH<i> and the output of inverter 418, a pre-decode circuit 426 for pre-decoding a signal RAD<8:2>, i.e., the output of level latch circuit 420, to output pre-decoded signals X<7:4>, X<11:8> and X<19:12>, and a level latch circuit 422 for receiving and holding a block decode signal BS in response to the signal RXLATCH<i> and the output of inverter 418 to output a signal BS_LATCH.

Row local control circuit 406 further include a level latch circuit 424 for receiving and holding the output of flip-flop 416 in response to the signal RXLATCH<i> and the output of inverter 418, a pre-decode circuit 430 for pre-decoding the output of level latch circuit 424 to output a pre-decoded signal X<3:0>, an inverter 428 for receiving and inverting the signal BS_LATCH, and an AND circuit 432 for receiving the output of inverter 428 and the pre-decoded signal X<3:0> to output a signal SD_F<3:0>.

With such a structure, flip-flops 414 and 416 are supplied with the local clock while the row-related operation is being conducted and the internal clock signal is being supplied. Therefore, unnecessary current consumption occurs in the bank in which the selection operation is not conducted.

Figure 21:
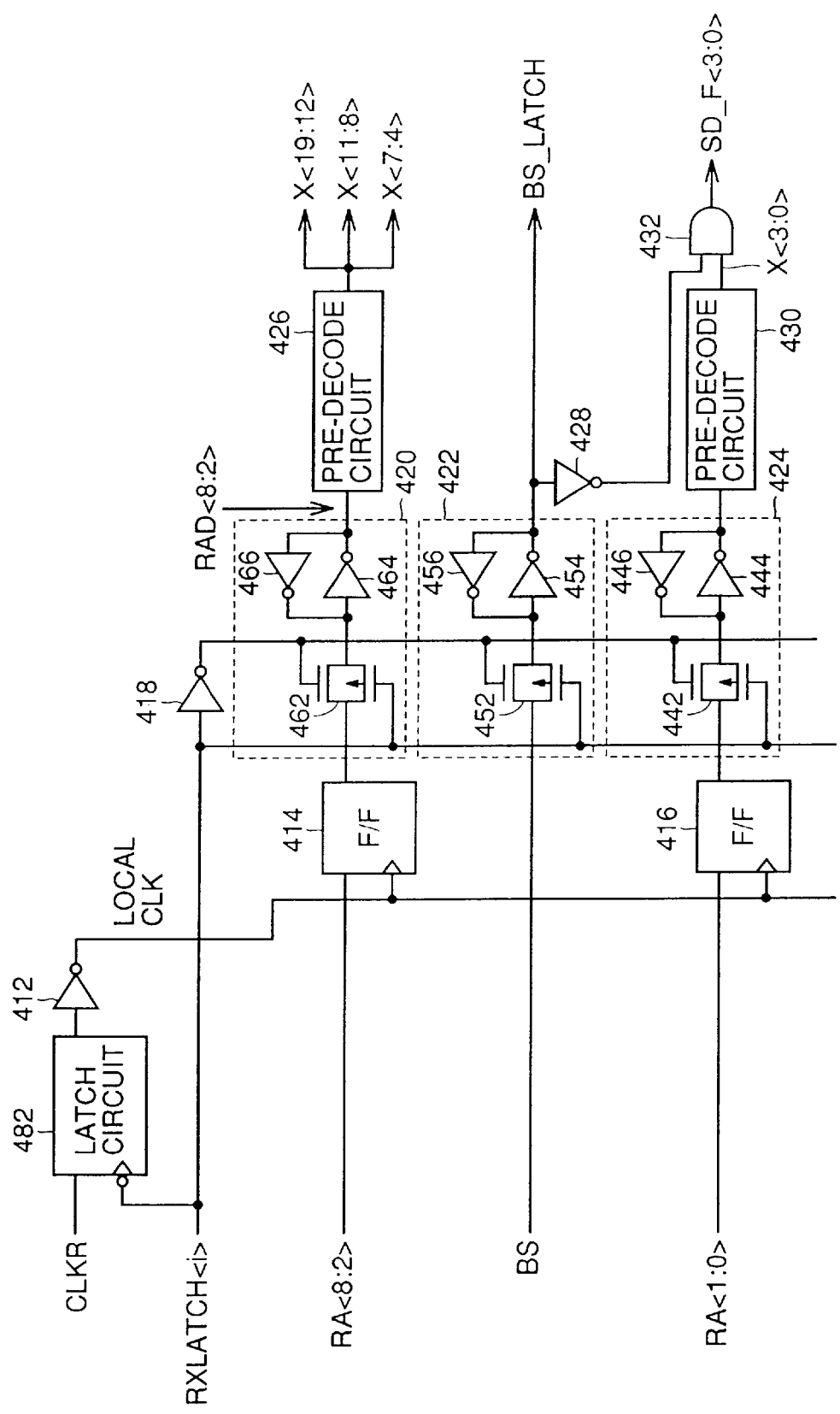
FIG. 21 is a circuit diagram showing the structure of a row local control circuit according to a third embodiment.

FIG. 21 is a circuit diagram showing the structure of a row local control circuit according to the third embodiment.

Referring to FIG. 21, the row local control circuit of the third embodiment is different from the row local control circuit shown in FIG. 20 in that the row local control circuit of the third embodiment includes a latch circuit 482 for receiving the row control clock signal CLKR in response to the signal RXLATCH<i> to supply the clock signal to inverter 412. Since the structure of the circuit shown in FIG. 21 is otherwise the same as that of the circuit show in FIG. 20, description thereof is not repeated.

Figure 22:
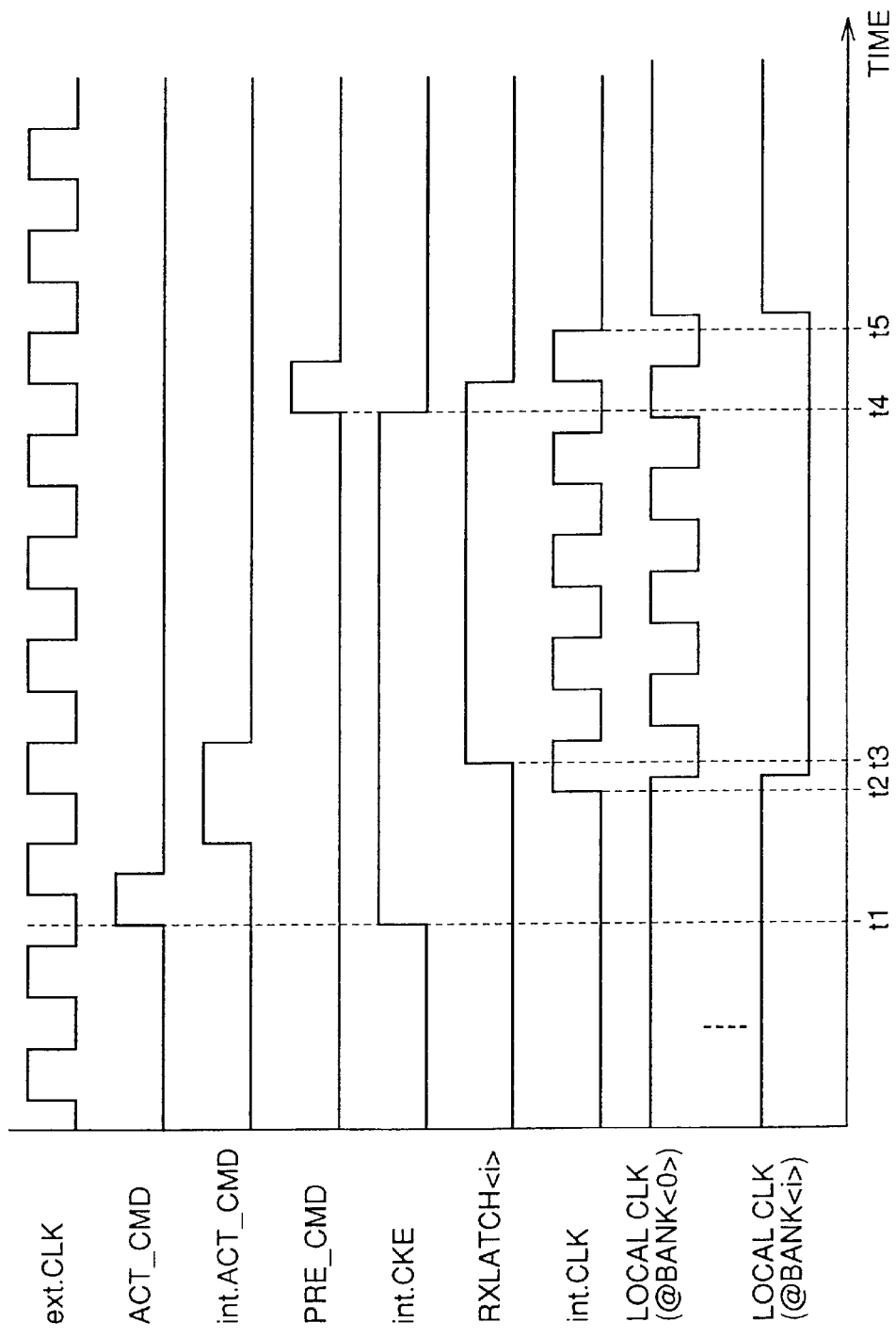
FIG. 22 is an operation waveform chart illustrating control of an internal clock and a local clock according to the third embodiment.

FIG. 22 is an operation waveform chart illustrating control of the internal clock and local clock according to the third embodiment.

Referring to FIG. 22, like the first embodiment, the internal clock int.CLK is generated from time t2 in response to input of the active command signal ACT_CMD at time t1. By using the circuit shown in FIG. 21, especially a local clock corresponding to the selected bank can be stopped. After a bank is selected and a corresponding row address RA<8:0> is latched in level latch circuit 420, 424, the clock need not be supplied to flip-flop 414, 416 until the bank <i> is subsequently selected and the signal RXLATCH<i> is activated. Accordingly, while the bank <i> is active after the rise of the signal RXLATCH<i> at time t3, the local clock is fixed to L level by latch circuit 482. After the fall of the signal RXLATCH<i>, the local clock rises to H level in response to the internal clock int.CLK.

In response to input of the pre-charge command at time t4, generation of the internal clock int.CLK is discontinued at time t5.

Thus, for a bank that does not require the clock input, the local clock can be stopped on a bank-by-bank basis. As a result, not only the current consumption in the standby state but also in the active state can be reduced.

[Other Applications]

A memory mounted in the system LSI of the present invention is not limited to the DRAM, and may be another memory such as a burst SRAM (Static Random Access Memory) operating in synchronization with a clock signal or a flash memory. The present invention may be applied to any memory as long as the memory is integrated on the same semiconductor substrate as that of the logic.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor device, comprising:
    a plurality of memory banks capable of designating a different row address, each of said memory banks including a plurality of memory cells arranged in rows and columns, and conducting data transmission and reception in synchronization with a clock signal; and
    a plurality of row address processing circuits provided corresponding to the respective memory banks, said row address processing circuits being responsive to said clock signal for accepting and holding a row address signal applied in order to specify a row of said memory cells, wherein
    each of said row address processing circuits includes
        a flip-flop circuit for accepting said row address signal in response to said clock signal, and
        a clock supply circuit for discontinuing supply of said clock signal to said flip-flop circuit after the corresponding memory bank is selected and said row address signal is accepted in said flip-flop circuit.

* * * * *